US012601954B2

(12) United States Patent
Hansen

(10) Patent No.: US 12,601,954 B2
(45) Date of Patent: Apr. 14, 2026

(54) SELECTIVELY CONFIGURABLE PHOTONIC LOGIC DEVICE

(71) Applicant: John Paul T. Hansen, Burien, WA (US)

(72) Inventor: John Paul T. Hansen, Burien, WA (US)

( * ) Notice: Subject to any disclaimer, the term of this patent is extended or adjusted under 35 U.S.C. 154(b) by 846 days.

(21) Appl. No.: 17/871,860

(22) Filed: Jul. 22, 2022

(65) Prior Publication Data

US 2023/0036440 A1 Feb. 2, 2023

Related U.S. Application Data

(60) Provisional application No. 63/225,257, filed on Jul. 23, 2021.

(51) Int. Cl.
*G02F 3/02* (2006.01)
*G02B 6/27* (2006.01)
*H03K 19/21* (2006.01)

(52) U.S. Cl.
CPC .......... *G02F 3/026* (2013.01); *G02B 6/2773* (2013.01); *H03K 19/21* (2013.01)

(58) Field of Classification Search
CPC ......... G02F 3/026; G02F 3/00; G02B 6/2773; H03K 19/21
See application file for complete search history.

(56) References Cited

U.S. PATENT DOCUMENTS

| | | | | |
|---|---|---|---|---|
| 2003/0112484 A1* | 6/2003 | Ponomarenko | ........... | G02F 3/00 |
| | | | | 359/108 |
| 2009/0190196 A1* | 7/2009 | Zaghloul | .............. | G02B 27/286 |
| | | | | 359/108 |
| 2011/0109972 A1* | 5/2011 | Ullrich | ...................... | G02F 3/00 |
| | | | | 359/629 |
| 2018/0180970 A1* | 6/2018 | Klotzer | .................. | G06N 10/20 |
| 2021/0382515 A1* | 12/2021 | Dubrovsky | ............. | G06E 1/045 |

OTHER PUBLICATIONS

Tsigaridas et al., "Z-scan technique through beam radius measurements," Appl Phys B 76:83-86, Jan. 8, 2003.

* cited by examiner

*Primary Examiner* — Thomas K Pham
*Assistant Examiner* — Jennifer A Jones

(57) ABSTRACT

Selectively configurable photonic logic gates, systems, and methods are provided. In at least one example, a photonic logic gate includes first and second inputs. The first input is configured to receive a first light having a first intensity and a first polarization. The second input is configured to receive a second light having a second intensity and a second polarization. The photonic logic gate is configured to generate a logical output based on the first and second intensities and the first and second polarizations of the first and second lights.

2 Claims, 15 Drawing Sheets

CONNECTION TO
PHOTOCOUPLING
LAYER

SIGNAL FROM
DETECTOR IN
ADJACENT CELL

INPUT $V_{CC}$

AND

C

LAYOUT OF
SHUTTER CIRCUITRY $V_{IN}$

C

INPUT $V_{CC}$    C

AND

SIGNAL FROM
DETECTOR IN
ADJACENT CELL

SELECTIVELY CONFIGURABLE PHOTONIC LOGIC DEVICE

TECHNICAL FIELD

The present disclosure generally relates to optical logic systems and devices, and more particularly relates to such systems and devices having selectively configurable photonic logic gates.

BACKGROUND

Optical computing or photonic computing uses photons produced by lasers or diodes for computation. Photonic logic generally relates to the use of photons (light) in logic gates (e.g., NOT, AND, OR, NAND, NOR, XOR, XNOR). Switching is typically obtained using nonlinear optical effects when two or more signals are combined.

BRIEF SUMMARY

In one or more embodiments, the present disclosure provides a photonic logic gate that includes a first input and a second input. The first input is configured to receive a first light having a first intensity and a first polarization. The second input is configured to receive a second light having a second intensity and a second polarization. The photonic logic gate is configured to generate a logical output based on the first and second intensities and the first and second polarizations of the first and second lights.

In one or more embodiments, the present disclosure provides a system that includes an array of selectively configurable photonic logic gates. Each of the photonic logic gates includes a first input configured to receive a first light having a first intensity and a first polarization, and a second input configured to receive a second light having a second intensity and a second polarization. Each of the photonic logic gates is configured to generate a logical output based on the first and second intensities and the first and second polarizations of the first and second lights.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electronic devices and head-worn devices, have not been shown or described in detail to avoid unnecessarily obscuring descriptions of the embodiments.

Throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the embodiments.

Figure 1:
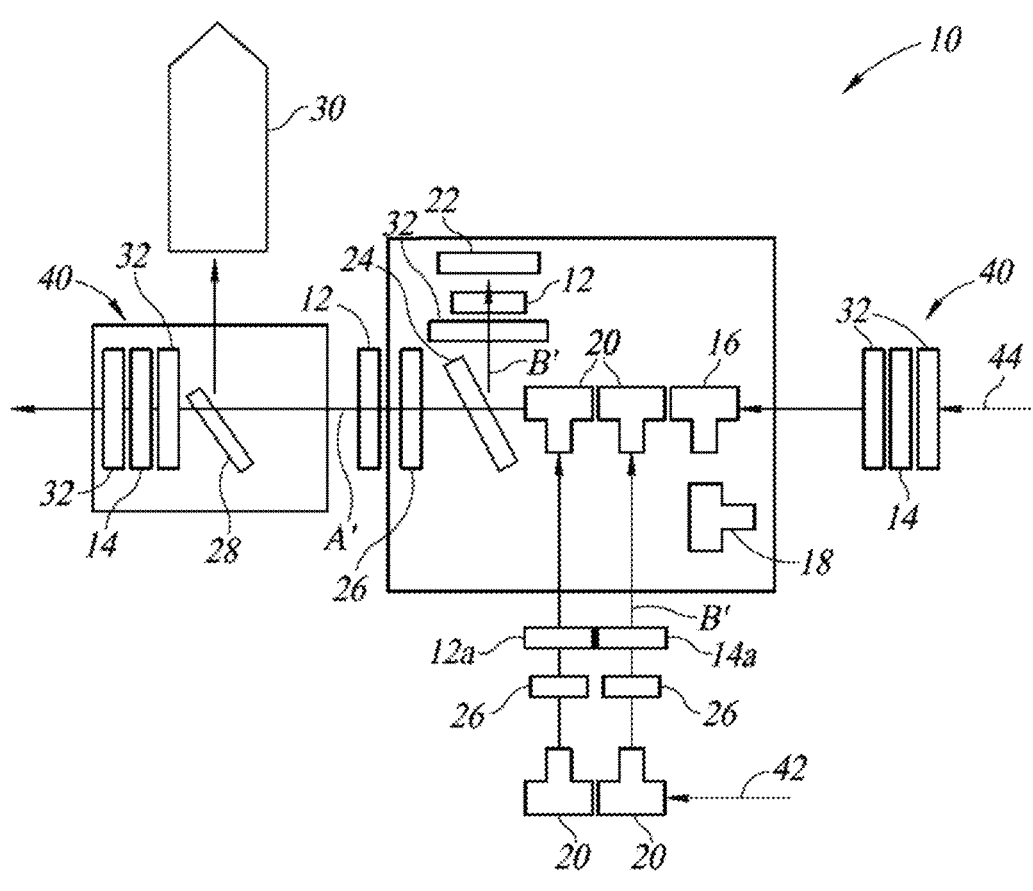
FIG. 1 is a schematic diagram illustrating a selectively configurable photonic logic gate, in accordance with one or more embodiments.
Figure 1:
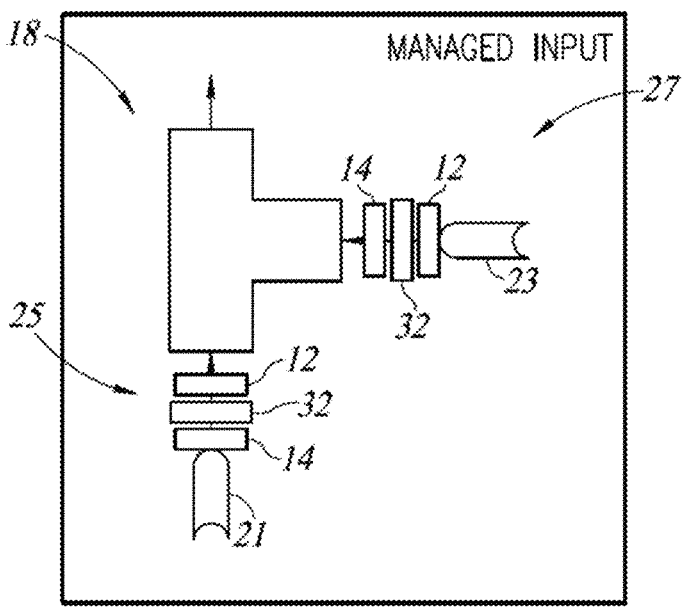

FIG. 1 illustrates a selectively configurable photonic logic gate 10, in accordance with one or more embodiments.

As shown in FIG. 1, the photonic logic gate 10 includes a plurality of "passing" absorptive linear polarizers 12, a plurality of "blocking" absorptive linear polarizers 14, a connecting input 16, a managed input 18, a plurality of optical networking devices 20 (which may be referred to herein as "Axons" (described in Applicant's U.S. Non-Provisional patent application Ser. No. 16/177,816, filed Nov. 1, 2018; the entirety of which is incorporated herein by reference) and which include at least a first path through which a beam may pass, and a beamsplitter operable to split a portion or copy of the beam to be transmitted along a second path), a photodetector 22 (which in some embodiments may be a photoresistor, and may be referred to herein as photoresistor 22), a polarized beam splitter 24, a plurality of optical shutters 26, a beamsplitter 28, a photodetector 30, and a plurality of liquid crystal rotators 32.

The photonic logic gate 10 operates on the general principle that light of one polarization (A') passes through the optical shutter 26. However, there is a "canceling" polarization (B') that is orthogonal to A' and can't pass the shutter 26, but has the power to shut it off. Optical logic gates are determined by how much of A' passes while B' is running. By controlling which polarizations enter the circuit 10, their intensities, and the sensitivity of the detectors, it is possible to manifest a variety of logic gates.

FIG. 1 is a schematic diagram of an embodiment of the photonic logic gate 10 which includes one electro optical component, i.e., the photoresistor 22. The circuit includes several optical networking devices 20 which overlap beams regardless of polarization, and a polarizing beam splitter 24 which separates the input polarizations into two separate paths. One beam path (the canceling polarization B') interacts with the photoresistor 22 which increases current to the optical shutter 26 (thereby charging the optical shutter 26 and change or adjusting one or more optical properties thereof) that rests in the path of the passing beam. Between the polarizing beam splitter 24 and the photoresistor 22, there is a rotator 32 and an absorptive linear polarizer 12. These components are used in series to adjust the degree to which the light of a specific intensity triggers the photoresistor 22. This functionally changes the light sensitivity of the photoresistor 22, and is an integral part of the circuit. As such, the photonic logic gate 10 may be selectively configurable (e.g., based on a selected light sensitivity of the photoresistor) to trigger the photoresistor 22 based on a desired intensity of light (e.g., of the canceling polarization B') and thereby to control the optical shutter 26 to selectively block or pass the beam (e.g., the beam A').

In FIG. 1, the arrows indicate that input laser light may enter through the passing polarizer 12a (which is always the passing polarization), the blocking polarizer 14a (which is always the canceling polarization), and the connecting input 16. The photonic logic gate 10 may receive laser light via a first input 42 and a second input 44. In some embodiments, the first and second inputs 42, 44 are provided from one or more other optical assembles, such as other photonic logic gates of an array of photonic logic gates (see FIG. 2). Moreover, the managed input 18 may include third and fourth inputs 21, 23, which may be emitted from lasers which are embedded within the photonic logic gate 10. The two lasers of the managed input 18 are output through respective filter assemblies 25, 27. A first filter assembly 25 includes a blocking polarizer 14, a rotator 32, and a passing polarizer 12 arranged in succession after the laser which outputs the third input 21. A second filter assembly 27 includes a passing polarizer 12, a rotator 32, and a blocking polarizer 14 arranged in succession after the laser which outputs the fourth input 23. As such, the first filter assembly 25 outputs an "A" polarized beam (e.g., a passing polarization) at an intensity set by the user, and the second filter assembly outputs a "B" polarized beam (e.g., a blocking polarization) at an intensity set by the user. When the beams from the managed input 18 are on, they act as a third input to the photonic logic gate 10.

The light input to the connecting input 16 passes through a series of components, including a rotator 32, an absorptive linear polarizer 14, and another rotator 32 (referred to herein as an optoelectronic assembly 40). The combination of these three components in series is utilized for building more complex logic gates, such as XOR or other gates. The initial rotator 32 and absorptive linear polarizer 14 determines whether the second input 44 laser light (which may be provided from an adjacent logic gate) will pass to the connecting input 16, and if so, how much or what intensity of the light will pass. The final rotator 32 describes the output polarization of the beam of light that passes into the photonic logic gate 10 from the second input 44. For example, the final rotator 32 may be utilized to set the polarization of the light passing into the logic gate 10 from the second input 44 as blocking or passing polarization by electrical control signals (which may be provided from a computer system as described in further detail later herein).

Figure 2:
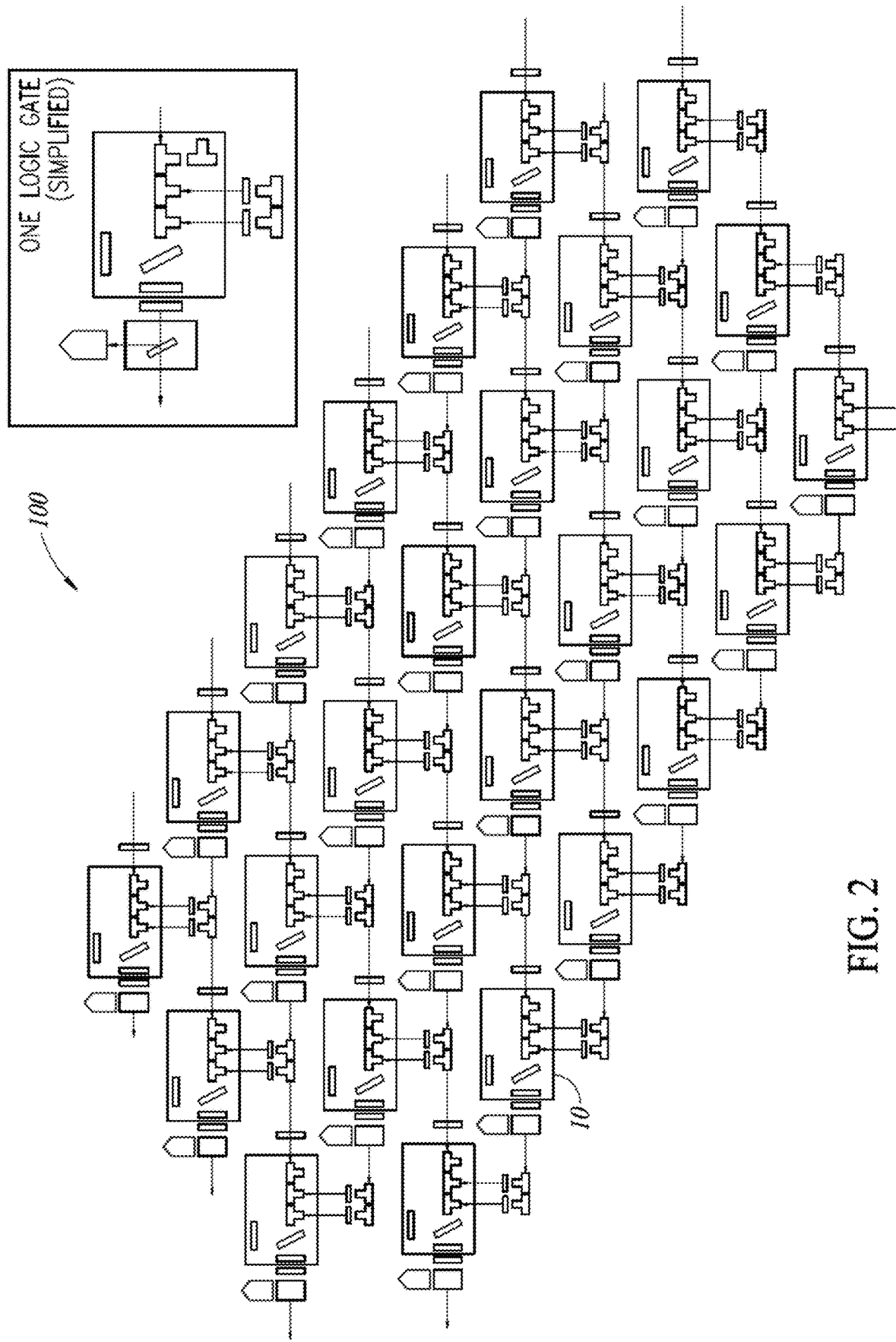
FIG. 2 is a schematic diagram illustrating an array of photonic logic gates which may be coupled to one another, in accordance with one or more embodiments.

As shown in FIG. 2, a plurality of photonic logic gates 10 may be arranged in an array 100 and daisy-chained or otherwise coupled to one another, and may interact with one another in a variety of configurations in order to implement various different logical functions.

In some embodiments, a single photonic logic gate 10 may be selectively configured to implement various different logical functions, such as an AND gate, an OR gate, a YES gate, a NOR gate, a NAND gate, a NOT gate, or other gates, as will be described in further detail below.

In the following description regarding the functionality of various logical functions implemented by the photonic logic gates 10, data (e.g., a logical "1" or logical "0") may be represented by an input optical beam in the form of a relative brightness, and in particular, relative brightness with respect to the sensitivity of the photoresistor 22. The brightness is described using a unitless number for ease of description of the functionality of the photonic logic gates 10 based on the relative brightness. It will be readily appreciated that the specific values of brightness provided herein are not limiting, and various different brightness levels may be utilized in various embodiments in order to convey data.

In implementing the various different logical functions, the input optoelectronic assemblies 40 featured before each second input 44 provide selective control over the intensity and polarization of each input, which is utilized in order to selectively implement AND, OR, NOT, NOR, and NAND gates. Changing the intensities and polarizations of the inputs allows each of the logic gates to be formed using the structure shown in FIG. 1, and the parameters in the specific logic gate descriptions.

In some embodiments, a photonic logic gate 10 may be selectively configured to implement an AND gate. In an example, the sensitivity of the detector 30 may be set to 100. A first beam (beam 1, which may be, for example, the first input 42) may have a passing polarization with an intensity of 50. A second beam (beam 2, which may be, for example, the second input 44) may also have a passing polarization with an intensity of 50. In this scenario, the combination of both beams passes through the polarizing beam splitter 24 without triggering the optical shutter 26 (e.g., as they have a same polarization and neither of the first or second beams is reflected by the beam splitter 24), and only their combined intensity is enough to satisfy a "true" condition at the photodetector 30, which may be an output of the logical AND gate (e.g., true or a logical "1"). As such, the photonic logic gate 10 may be utilized as an AND gate, since the output is only enabled as a logical "high" if both of beams 1 and 2 are high (e.g., respectively having an intensity of 50, in this example). Otherwise, if either or both of beams 1 and 2 are logical "low" (e.g., having an intensity below 50), the combined intensity of the input beams will be below the threshold level of the photodetector 30 in order to provide a high output, and thus the output of the photodetector 30 in this scenario will be a logical "low."

In some embodiments, a photonic logic gate 10 may be selectively configured to implement an OR gate. In an example, the sensitivity of the detector may be set to 100. The first beam (beam 1) may have a passing polarization with an intensity of 100. The second beam (beam 2) may also have a passing polarization with an intensity of 100. In this scenario, the combination of both beams passes through the polarizing beam splitter 24 without triggering the optical shutter 26, and the intensity of either beam individually, or the combined intensity, is enough to satisfy a true condition at the photodetector 30, which may be an output of the logical OR gate (e.g., true or a logical "1"). As such, the photonic logic gate 10 may be utilized as an OR gate, since the output is enabled as a logical "high" if either or both of beams 1 and 2 are high (e.g., respectively having an intensity of 100, in this example). On the other hand, if both of beams 1 and 2 are logical "low" (e.g., having an intensity below 100), the combined intensity of the input beams will be below the threshold level of the photodetector 30 in order to provide a high output, and thus the output of the photodetector 30 in this scenario will be a logical "low."

In some embodiments, a photonic logic gate 10 may be selectively configured to implement a YES gate. In an example, the sensitivity of the detector may be set to 0. As such, any beam that passes through the optical shutter 26 will be read or interpreted as "true" or logical "1". In contrast, the absence of a passing beam will be read or interpreted as "false" or logical "0".

In some embodiments, a photonic logic gate 10 may be selectively configured to implement a NOR gate. In an example, the sensitivity of the detector may be set to 100. The first beam (beam 1) may have a canceling polarization with an intensity of 150. The second beam (beam 2) may also have a canceling polarization with an intensity of 150. A third beam (beam 3, which may be, for example, an output beam of the managed input 18) may have a passing polarization with an intensity of 100. In this scenario, neither beam 1 or beam 2 can pass through the optical shutter 26 to reach the photodetector 30. Instead, beams 1 and 2 are reflected by the polarizing beam splitter 24 (which reflects beams having the canceling polarization) into the photosensitive circuit (i.e., through the rotator 32, the absorptive linear polarizer 12, and to the photoresistor 22), thereby triggering the optical shutter 26 and blocking the third beam from passing through the optical shutter 26. This results in a false condition (or logical "0") being output by the logical NOR gate if either or both of beams 1 and 2 are present. On the other hand, if both of beams 1 and 2 are logical "low" (e.g., each having an intensity below a threshold intensity of the photoresistor 22 for controlling the optical shutter 26), then the optical shutter 26 will not be activated to block the third beam, and the third beam thus passes through to the photodetector 30, which outputs a logical "high."

In some embodiments, a photonic logic gate 10 may be selectively configured to implement a NAND gate. In an example, the sensitivity of the detector may be set to 100. The first beam (beam 1) may have a canceling polarization with an intensity of 50. The second beam (beam 2) may also have a canceling polarization with an intensity of 50. The third beam (beam 3) may have a passing polarization with an intensity of 151. In this scenario, neither beam 1 or beam 2 can pass through the optical shutter 26 to reach the photodetector 30. Instead, beams 1 and 2 are reflected by the polarizing beam splitter 24 into the photosensitive circuit (i.e., through the rotator 32, the absorptive linear polarizer 12, and to the photoresistor 22), thereby triggering the optical shutter 26 and blocking the third beam from passing through the optical shutter 26. This results in a false condition (or logical "0") being output by the logical NOR gate if either or both of beams 1 and 2 are present. However, the false condition is output only if both beams 1 and 2 are present. If only one of beams 1 or 2 are present, the intensity (50) of the canceling polarization is not sufficient to trigger the optical shutter 26 to block the passing of the third beam (beam 3), and thus in such a case, the output of the logical NAND gate is "true" or logical "1".

In some embodiments, a photonic logic gate 10 may be selectively configured to implement a NOT gate. In an example, the sensitivity of the detector may be set to 100. The first beam (beam 1) may have a passing polarization with an intensity of 75. The second beam (beam 2) may have a canceling polarization with an intensity of 250. The third beam (beam 3) may have a passing polarization with an intensity of 75. In this scenario, if beam 2 turns on at all (i.e., if beam 2 is present), it will be strong enough to trigger the optical shutter 26 to an extent that would prevent both beam 2 and beam 3 from passing through the optical shutter 26 to reach the photodetector 30. Thus, unless beam 2 turns on (i.e., unless beam 2 is present), the photodetector 30 will output a "true" condition (or logical "1"), otherwise the output will be "false" (or logical "0").

In some embodiments, a plurality of photonic logic gates 10 may be coupled to one another and may selectively configured to implement various different logical functions, such as an XOR gate or an XNOR gate, as will be described in further detail with respect to FIGS. 3 and 4. The plurality of photonic logic gates 10 may be subsets of an array of photonic logic gates 10, as shown in FIG. 2, which are selectively operated to implement the desired logical functions.

Figure 5:
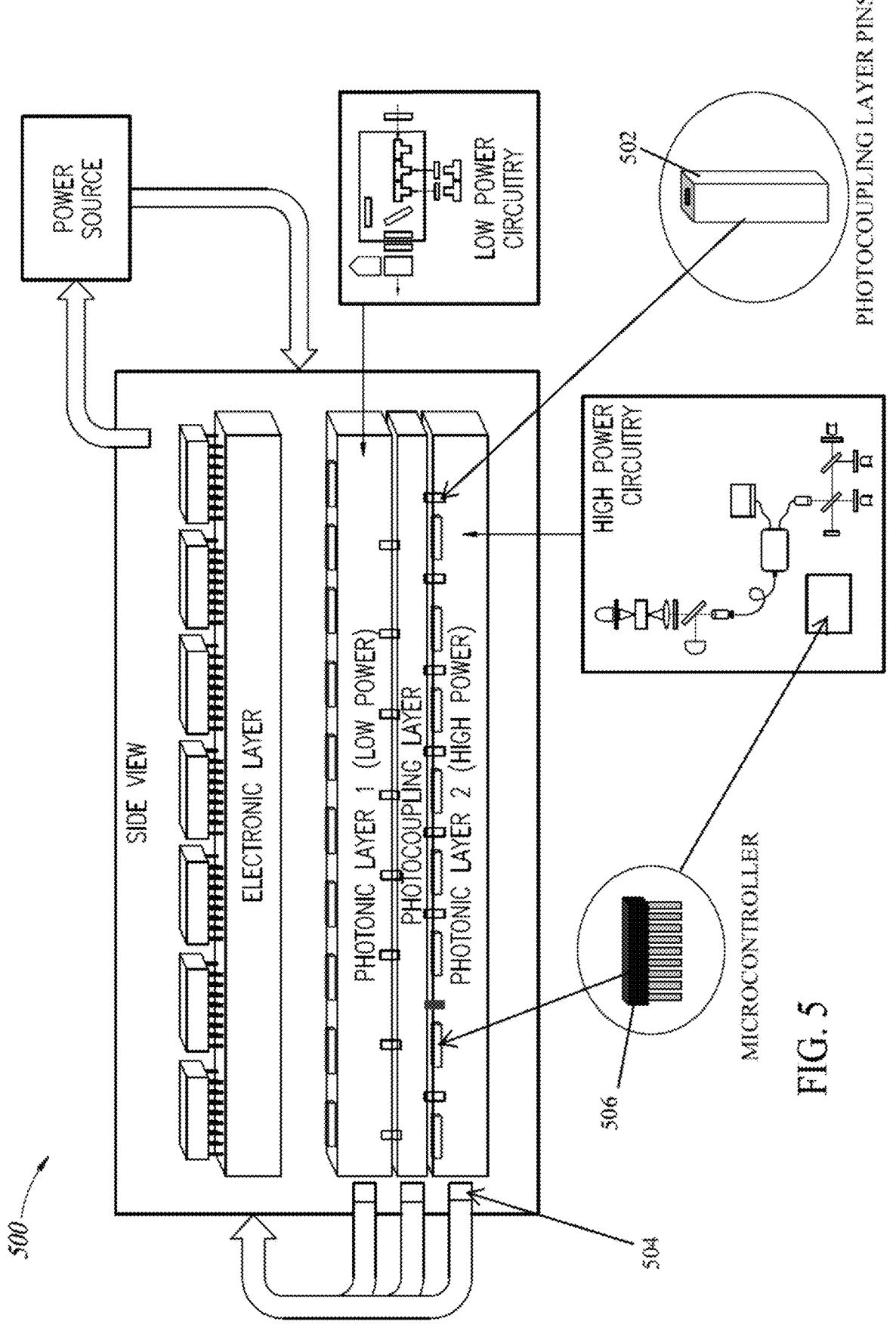
FIG. 5 is a schematic diagram illustrating an optical computing system, in accordance with one or more embodiments.

While not shown in FIGS. 1 and 2, it will be readily appreciated that each of the photonic logic gates 10 may include a microprocessor or microcontroller 506, for example, as shown in FIG. 5.

Figures 3, 4:
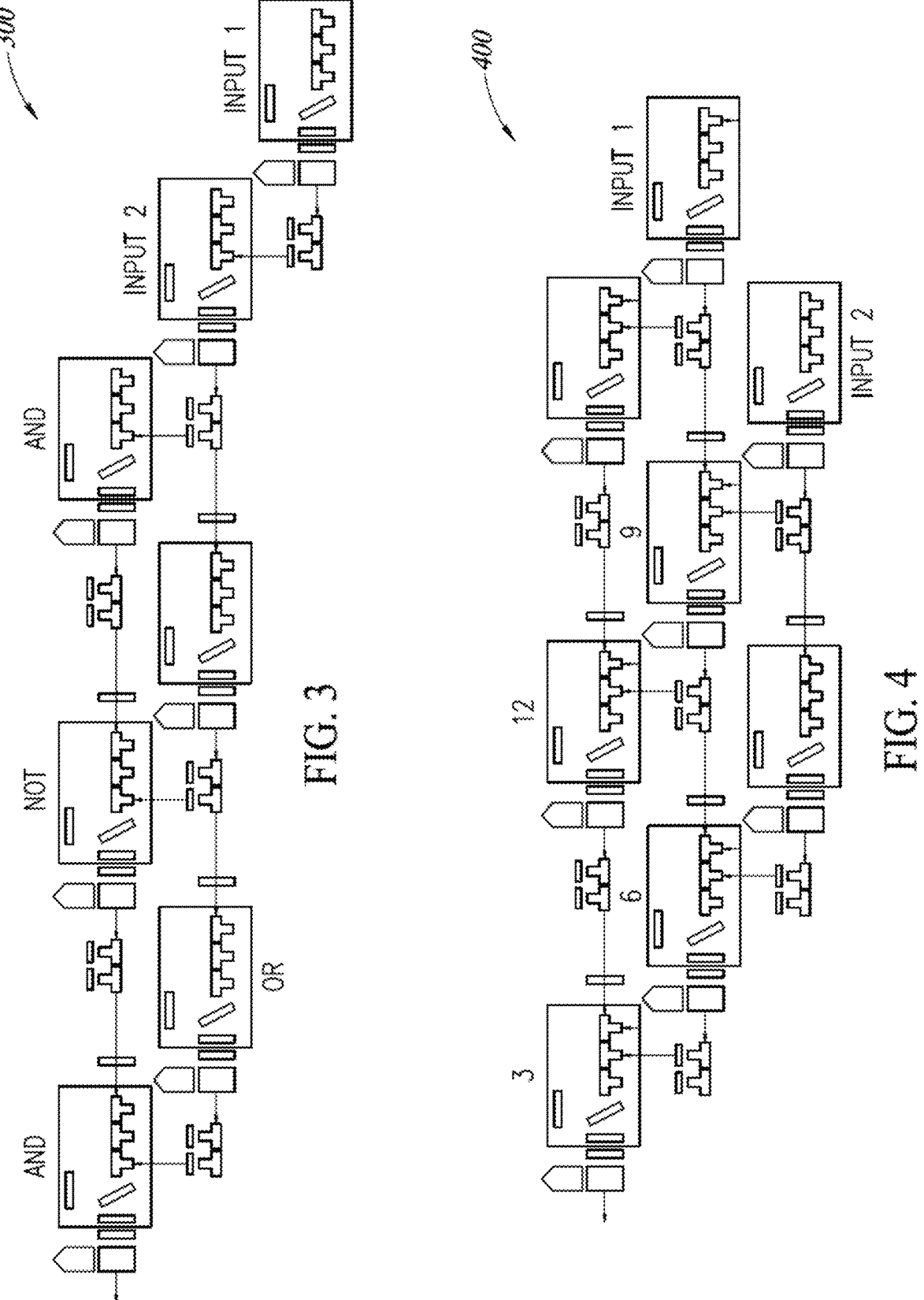
FIG. 3 is a schematic diagram illustrating a XOR logical gate which may be implemented by a plurality of photonic logic gates illustrated in FIG. 1, in accordance with one or more embodiments.
FIG. 4 is a schematic diagram illustrating a XNOR logical gate which may be implemented by a plurality of photonic logic gates illustrated in FIG. 1, in accordance with one or more embodiments.

FIG. 3 illustrates a XOR logical gate 300 which may be implemented by seven individual photonic logic gates 10, which may be coupled to one another and may be a portion or subset of the array 100 of photonic logic gates 10 shown in FIG. 2. Two inputs (inputs 1 and 2) having the same polarization are sent simultaneously from two separate photonic logic gates. The sources for both inputs 1 and 2 are divided between an AND gate with a sensitivity of 100 and an OR gate with a sensitivity of 50. The NOT gate has a sensitivity of 75, and receives the combined inputs of 1 and 2 from the subsequent AND gate. Meanwhile, the OR gate receives the combined inputs of 1 and 2, and passes them into a final AND gate that has a sensitivity of 101. The NOT gate will pass light to the final AND gate only if the input intensities are high enough. If both of the inputs directed into the final AND gate are sufficiently high, the detector will be triggered and read "True" (or logical "1").

The gate labeled "Input 2" mostly serves as a transmitter and multiplexer. It produces a signal in its own managed input unit 18 (as shown in FIG. 1), combines it with input 1, and sends them both as a single output. It is important to note that once inputs 1 and 2 are sent on their way as two overlapped beams, they should be at the same intensity. This means the initial input 1 intensity should actually be greater than the initial input 2 intensity (in some embodiments, for example, 1.75 times the initial input 2 intensity), because its output passes through seven beamsplitters prior to being combined with input 2, while input 2 only passes through four beamsplitters. From that point on, both beams pass through the same number of splitters before reaching the final AND gate. One potential caveat is that the NOT gate produces a new beam, but the intensity can be set proportionally to that of the output of the OR gate, which will be $\frac{1}{16}$th the original intensity of the combined inputs. When the output of the OR gate reaches the final AND gate, it will be $\frac{1}{30}$th the initial input. The reduced intensity can be compensated, for example, by using a relatively high optical decibel input, which will not represent any kind of a substantial reduction in detectability.

As is the case with any XOR gate, the final output of the entire gate is only true when either inputs 1 and 2 are running, but not both, and not neither.

FIG. 4 illustrates a XNOR logical gate 400 which may be implemented by eight individual photonic logic gates 10, including four individual NOR gates (labeled 3, 6, 9, and 12) each of which produces its own beam, two input gates (inputs 1 and 2), and additional photonic gates (not labeled) which just pass received light. Additionally, the light that enters NOR gates 3, 6, 9, and 12 are all "canceling" polarizations. Input 1 produces or outputs "passing" polarized light, but it can be changed to the blocking polarization in the optoelectronic assemblies 40 for both NOR gates 9 and 12 for input at the connecting input 16 of the NOR gates 9 and 12. Input 2 produces or outputs blocking light, but it can be changed to pass the intermediate gate between it and NOR gate 6 in the intermediate gate's optoelectronic assembly 40 at the connecting input 16, and then flipped back to blocking again before entering NOR gate 6 in the intermediate gate's output rotator 32.

Inputs 1 and 2 are split. Input one enters NOR gates 9 and 12. In NOR gate 12, the intensity of input 1 will be reduced (e.g., to $\frac{1}{28}$th the starting value). In NOR gate 9, the intensity of input 1 will be reduced (e.g., to $\frac{1}{16}$ the starting value). Input 2 enters NOR gates 9 and 6. In NOR gate 9, the input will be reduced (e.g., to $\frac{1}{16}$th the starting value). In NOR gate 6, the input will be reduced (e.g., to $\frac{1}{28}$th the starting value). This actually means that the inputs deliver equal intensities of light into NOR gates 12 and 6. They also each deliver the same amount of less-intense light into NOR gate 9.

The output of NOR 9 will go to NOR gate 6 and also to NOR gate 12. In NOR gate 6, the input will be reduced (e.g., to $\frac{1}{20}$th the starting value). In NOR gate 12, the input will be reduced (e.g., to $\frac{1}{16}$th the starting value). NOR gate 12 may adjust the brightness of its inputs using the optical shutter 26 so that it receives an amount of light exactly equal to the light received by NOR gate 6. This may be the most elegant solution because it does not rely on any change in the sensitivity of the photoresistor 22. The same solution may be applied to NOR gate 3, which should diminish the output coming from NOR gate 6 to be equal to the output coming from NOR gate 12, so that both sources of light are equal.

As is the case with any XNOR gate, the final output of the entire gate is only true when both or neither inputs 1 and 2 are running.

This process of linking gates together may be used to generate entire computer chips, in some embodiments, by stringing photonic logic gates 10 together such that they perform the same sequence of operations expected of electronic gates. An engineer who is sufficiently familiar with the technology should find that they are able to replicate electronic logic perfectly using beams of light.

FIG. 5 illustrates a system 500 that includes a low power photonic layer (photonic layer 1), which may include an array 100 of photonic logic gates 10 as previously described herein, for example, with respect to FIGS. 1 and 2. The system 500 further includes an additional layer (photonic layer 2) of photonic circuitry that includes an array of high-power all-optical logic gates. Photonic layer 2 is composed of a series of modules that form logic gates by using Kerr lenses—transparent materials whose effective refractive indices depend on the intensity of the transitive light itself and the materials' nonlinear refractive indices.

As will be described in further detail herein, the system 500 includes two layers of a computer processor that include categorically different kinds of photonic circuits, with each being uniquely designed to cross-communicate: one (e.g., photonic layer 2) generally operating at a high speed and high power, and the other (photonic layer 1) operating at a low power with some operations taking longer. Being able to arbitrarily split individual parts of operations based on their power and speed requirements allows an engineer to optimize a processing chip as may be desired to meet various design parameters. Embodiments provided herein are particularly advantageous because the hardware may be "re-wired" optically at any time, and any logic operation can run at the speed of light.

Furthermore, system 500 presents a unique combination of photonic circuitry, with such flexibility that both layers (photonic layers 1 and 2) can even act as volatile memory for the other in some embodiments. This improves pattern retention, and allows the chip architecture described in this document to expand memory by expanding CPU capacity (and vice versa).

As shown in FIG. 5, the system 500 includes the high-power all-optical circuitry (photonic layer 2), and the low power layer (photonic layer 1), each of which may include lasers or laser circuitry operable to generate the laser beams discussed herein. Both layers are physically separate, but may be linked communicatively to the electronic layer, and to each other via a photocoupling layer, which is described in further detail later herein with respect to FIGS. 11 and 12. In some embodiments, each of the high-power all-optical circuitry (photonic layer 2) and the low power layer (photonic layer 1) may be communicatively coupled (e.g., electrically or optically coupled) to the photocoupling layer by one or more photocoupling layer pins 502. In some embodiments, each of the photonic logic gates 10 of the photonic layer 1 may be coupled to the photocoupling layer by one or more photocoupling layer pins 502. Similarly, in some embodiments, each of the photonic logic gates 610 (see, for example, FIGS. 6 and 8) of the photonic layer 2 may be coupled to the photocoupling layer by one or more photocoupling layer pins 502.

In some embodiments, one or more of photonic layer 1, photonic layer 2, and the photocoupling layer are stacked with pins (e.g., photocoupling layer pins 502) and headers in a manner similar to microcontroller or board shields. For example, one or more of photonic layer 1, photonic layer 2, and the photocoupling layer may include or otherwise be connected to a circuit board that includes a set of pins or other electrical or optical connections which may communicatively couple the layers to one another when arranged, for example, in a stack. Once stacked, the photonic layer 1, photonic layer 2, and the photocoupling layer may be plugged in to the electronics layer like RAM cards, via physical slots 504. The slots 504, in some embodiments, may connect with flat copper or other conductive contacts present on one edge of each of the layers. The copper or other conductive contacts may be electrically coupled to the microcontrollers 506 which may be present on each of the layers, and to the intermediate circuitry between photonic logic gates via copper or other conductive contacts that run across the bottom of the board. This accounts for the source of the "C" signals present throughout document diagram. Through these connections, electronics layer manages whether various components are on or off, and at what power they are running.

As shown in FIG. 5, in some embodiments, a plurality of microcontrollers 506 may be included in or communicatively coupled with each of the photonic layers 1 and 2. In some embodiments, each of the photonic logic gates of photonic layers 1 and 2 may be communicatively coupled to a microcontroller 506. In some embodiments, a microcontroller 506 is included as part of each of the photonic logic gates of photonic layers 1 and 2.

In some embodiments, the photocoupling layer pins 502 facilitate improved manufacturing of the system 500, as each of the layers (e.g., electronic layer, photonic layer 1, photonic layer 2, and the photocoupling layer) may be separately manufactured and assembled (e.g., to form the system 500) using the photocoupling pins 502.

The electronic layer manages whether various components are on or off, and at what power they are running. The lasers on photonic layer 2 will generally require the most power, which in some embodiments may be on the order of hundreds of watts. This can be achieved more easily through pulsing, but a strong power source may nevertheless be included to provide suitable laser power.

Both the photocoupling layer and the photonic layer 2 may be coupled to a separate power source. In some embodiments, the power source may be managed by the electronic layer. The electronic layer may split a processing operation between photonic layers 1 and 2 so that some operations are high-powered and run all-optically (e.g., via photonic layer 2), and others are low powered but may be slower in some cases because of the optoelectronic components of photonic layer 1 (including, for example, the photoresistor 22, rotators 32, optical shutter 26, photodetector 30, laser diodes, and the like). The processing operations may thus be selectively configured and assigned to either photonic layer 1 or 2 as may be desired, for example, to save power for a given system, or to maximize the speed of certain parts of an operation but not others (which may cause it to behave differently, per the design of the user). For example, the AND gates of photonic layer 1 would run just as fast as AND gates of photonic layer 2, but may generally utilize many orders of magnitude less power. Similarly, XOR and XNOR gates can be done in a single operation in photonic layer 2 (e.g., XOR and XNOR gates can be implemented in a single circuit or module in photonic layer 2), but would generally be implemented in a plurality of logic gates in photonic layer 1. Allowing the layers to work together thus provides many operational benefits as described herein.

As will be described in further detail later herein, the power source may be connected to specific parts of the photocoupling layer.

Figure 6:
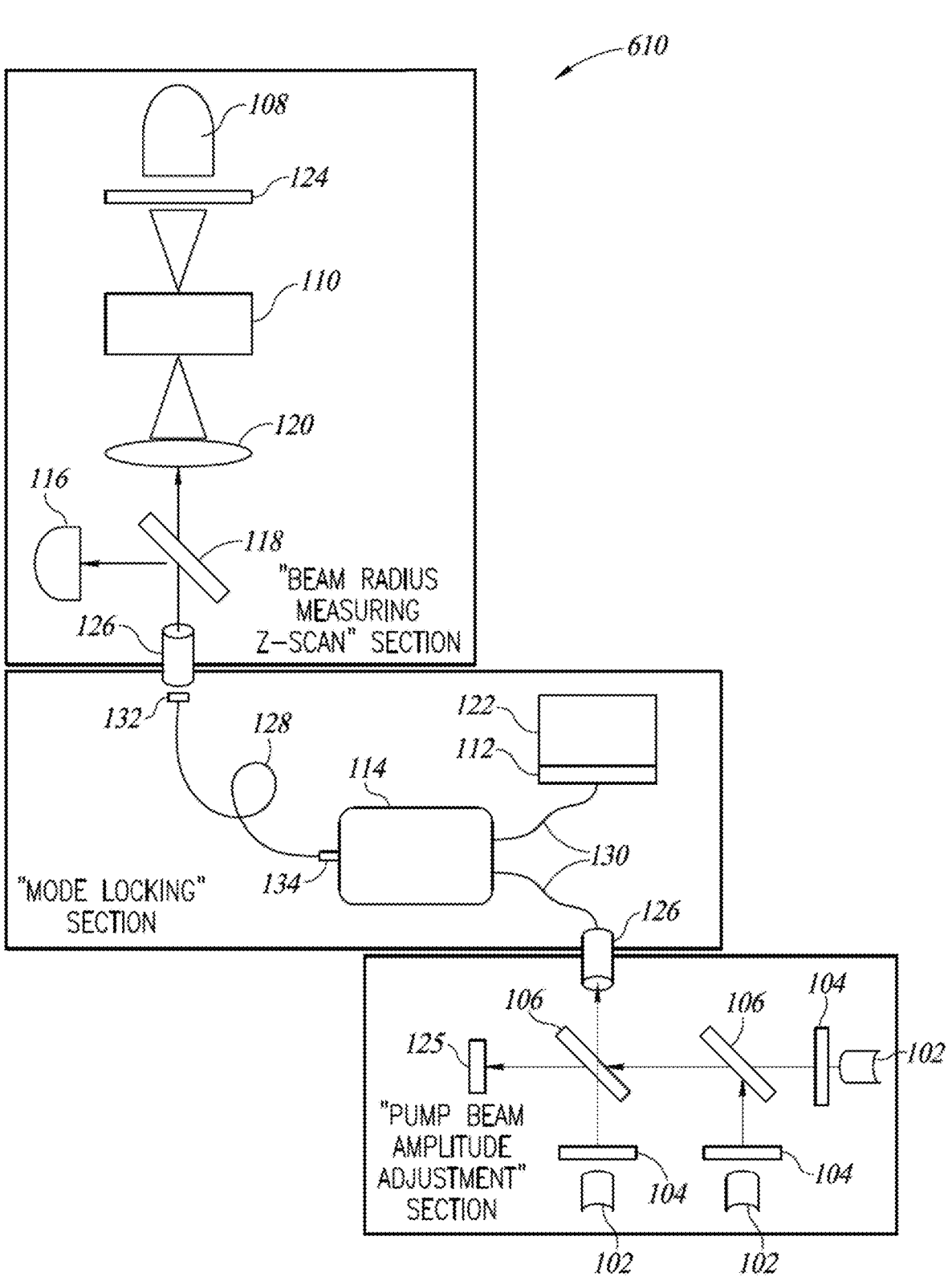
FIG. 6 is a schematic diagram illustrating a selectively configurable photonic logic gate, in accordance with one or more embodiments

FIG. 6 illustrates a selectively configurable photonic logic gate 610, in accordance with one or more embodiments. The photonic logic gate 610 may be included in the photonic layer 2, for example, and may be a high power photonic logic gate.

As shown in FIG. 6, the photonic logic gate 610 includes a plurality of lasers 102, a plurality of liquid crystal shutters 104, a plurality of 50/50 beamsplitters 106, a logic detector 108, a layer of nonlinear material 110 (which may include an attenuator 124, such as an absorptive polarized filter, on a surface thereof), a semiconductor saturable absorber mirror (SESAM) 112, a dichroic coupler 114, a calibration detector 116, a 10:90 reflective beamsplitter 118, a convex lens 120, a signal laser 122, a beamstop 125, a plurality of aspheric lenses 126, an erbium doped fiber 128, a plurality of fiber cables 130, a partially reflective splice 132, and a splice 134.

The construction of the high-power photonic logic gate 610 is conceptually similar to that of the photonic logic gates 10 of photonic layer 1. As shown in FIG. 6, the photonic logic gate 610 generally includes three sections: a pump beam amplitude adjustment section; a mode locking section; and a beam radius measuring Z-Scan section. The pump beam amplitude adjustment and mode locking sections combine beams and is generally a variation on a Mach-Zehnder interferometer.

Turning now to the pump beam amplitude adjustment section, this section may also be referred to as the "gain compression" portion of the photonic logic gate 610. In essence, the three lasers 102 drive the pump beam's total output power (e.g., the combined power of the three input laser beams 102 at the aspheric lens 126 at the output of the pump beam amplitude adjustment section), and so determines the total amplification of a signal beam in the erbium-doped fiber 128. This gives the photonic logic gate 610 control over the total brightness of the final beam (e.g., as provided to the beam radius measuring Z-scan section, after the beamsplitter 118), which is an important feature for such logic gates.

One of the three lasers 102 is intended to provide the "starting brightness value" and may be computer controlled, while the remaining two lasers 102 may be considered as input beams, and may be either computer controlled or adjacent-circuit triggered. The input pump beams are combined in beamsplitters 106, and launched into the aspheric lens 126, which connects the pump beam amplitude adjustment section to the mode locking section. The intensity of the lasers 102 prior to launching may be selectively determined by the user or computer by applying a voltage potential across the liquid crystal (LC) rotators 104. Applying a voltage to the rotators 104 changes their opacity and the total output brightness added to the mode locking section.

Turning now to the mode locking section, this section is a simple fiber laser, which are common in the industry. Such fiber lasers may feature a dichroic coupler 114 to combine the pump with the signal beam emitting from a laser diode 122 that includes a semiconductor saturable absorber mirror (SESAM) 112 in the resonance cavity. The dichroic coupler 114 is spliced to the erbium-doped fiber cable 128 that is partially reflective on its farthest end which couples to another aspheric lens 126. The resonance of the light within the Er-doped cable 128 determines the pulse length of the fiber, and can be easily adjusted to the desired timing (e.g., the femtosecond regime) for the Z-Scanning portion of the photonic logic gate 610. As such, the length of the Er-doped cable 128 determines both the pulse length and the amount of amplification. In general, longer cables lead to slower pulses and brighter output beams. The output of the mode locking section is coupled to another aspheric lens 126 which launches the light within the fiber to the Z-Scanning section of the photonic logic gate 610.

Turning to the beam radius measuring Z-scan section, the role of the "Z-Scan" section is to focus light from the output of the previous section (i.e., from the mode locking section) to a small point on the surface of a nonlinear material (E) and use its variable intensity to further focus or defocus the final cone of light by using the nonlinear properties of the material. This technique is described, for example, by Tsigaridas, G., Fakis, M., Polyzos, I. et al. Z-scan technique through beam radius measurements, Appl Phys B 76, 83-86 (2003), the entirety of which is incorporated herein by reference. Z scanning mechanisms are designed to probe the nonlinear mechanisms of various dielectric materials while avoiding optical damage, and are therefore suitable for use in the Z-Scan section. The Z-Scan section of embodiments of the present disclosure is slightly different from the standard beam radius-measuring setup, as the Z-Scan section of this disclosure avoids use of mechanical components. However, the Z-Scan section performs the same logical operations as in the conventional approaches. The differences will be described in further detail later herein.

After being combined in the second beamsplitter 106, the beam continues through the 10% reflective beamsplitter 118, which reflects 10% of the light in the beam and passes the other 90% of the light, in some embodiments. However, embodiments are not limited thereto, and in various embodiments, the reflection and transmission percentages of the beamsplitter 118 may have various values. The intensity of the 10% beam is measured in the calibration detector 116 to determine the beam's polarization, and the overall strength of the combined beam.

Then, the polarized beam passes into a convex lens 120, whose focal point may have a width of 20-200 micrometers, in some embodiments, and may lie at the face of the nonlinear material 110. The beam then passes through the nonlinear material 110, which physically focuses or defocuses the beam based on its intensity, and outputs a wider or narrower spot on the surface of the logic detector 108. A key purpose of the convex lens 120 is to focus the already very intense optical pulse down to as small an area as possible or practical so that the flux density is as high as possible or desired in order to make the nonlinear lensing effect pronounced enough to perform logic calculations as described herein.

The logic detector 108 may include a plurality of photoresistors which have a resistance that varies based on the intensity or luminosity of received light. It is important not to saturate the photoresistors in the detector 108, which could occur due to the high wattage of the lasers involved in computation. For this reason, a beam attenuator 124 may be included at or near the surface of the detector 108 to reduce the already-focused light to a level that is safely and reliably detectable.

In various embodiments, three different kinds of attenuators may be used as the beam attenuator 124. A first type of attenuator includes a thin (e.g., less than 1 mm thickness) electro-absorption modulator, which would allow the attenuation of the laser beam to be controlled by the computer. For example, the electro-absorption modulator may have electrical terminals, such as an anode and a cathode, which may receive control signals from a computer or CPU (which in some embodiments may be provided from the electronic layer of the system 500 shown in FIG. 5, for example, control signals provided from the electronic layer to one or more microcontrollers 506 of the high-power photonic layer 2).

A second type of attenuator includes a thin absorptive polarizer oriented at an angle (e.g., at 84.26 degrees) with respect to the plane of the transitive light, which would yield a fraction (e.g., about $\frac{1}{100}^{th}$) of the original beam intensity which passes to the detector 108. The angle of orientation of the absorptive polarizer may be adjusted as may be desired, for example, based on design considerations. For example, in some embodiments, it may be advantageous to arrange the thin absorptive polarizer at 88.19 degrees to the plane of the transitive light, which would transmit about $\frac{1}{1000}$th of the original beam.

A third type of attenuator includes a neutral density filter to attenuate the beam. Such an attenuator may have a high resistance to optical damage.

A fourth type of attenuator includes a beamsplitter disposed in front of the detector 108, and the beamsplitter may be configured to reflect a majority of light away from the detector 108 and out of the path (and in some embodiments, the reflect light may be directed to a beamstop).

All of the above solutions may include some form of resistance to optical damage, which may be desirable considering the small width of the beam and the intensity of the light itself. Failing to attenuate the light, and saturating the detector will cause the photoresistor to hold a charge and grow sluggish in response to optical pulses. This is, of course, detrimental to the long-term functioning of the computer (e.g., the system 500). An antireflective coating may be included on the attenuator, and may be desirable under ideal circumstances to prevent thin film effects in some embodiments.

After passing through the nonlinear material 110 and attenuator 124, the width of the beam on the surface of the detector 108 is logically evaluated by the detector 108, which is described in further detail later herein.

The detector 108 both evaluates the logic for the present photonic logic gate 610, and when activated also sends a logic signal that completes one half of a subsequent AND gate to trigger a transistor which will provide a sufficient voltage to trigger the next gate's lasers—with higher voltages across the LC shutters generally indicating higher absorption of the transitive light. That is to say, that the higher the LC shutter voltage, the dimmer the LC shutter makes the beam. The second signal is provided by the computer. This is shown, for example, in FIG. 8, which shows that the output of the detector is provided as a first input to an AND gate, and the second input (C) to the AND gate is provided as an input from the computer itself. The computer may, in some embodiments, provide both signals to the AND gate whenever desired. That scenario is described in further detail herein with respect to FIG. 8. The detector 108 also provides a second signal to an AND gate in the photocoupling layer (labeled "to CPU" in FIG. 8), which is identical to the other AND gate previously described, and whose other input is triggered by the computer directly. By varying the intensities of the beams, it is possible to make the six universal logic gates, which are discussed in the following description.

For the following model described hereafter, a conceptual framework is provided for focusing behavior in a Kerr lens.

Figure 10:
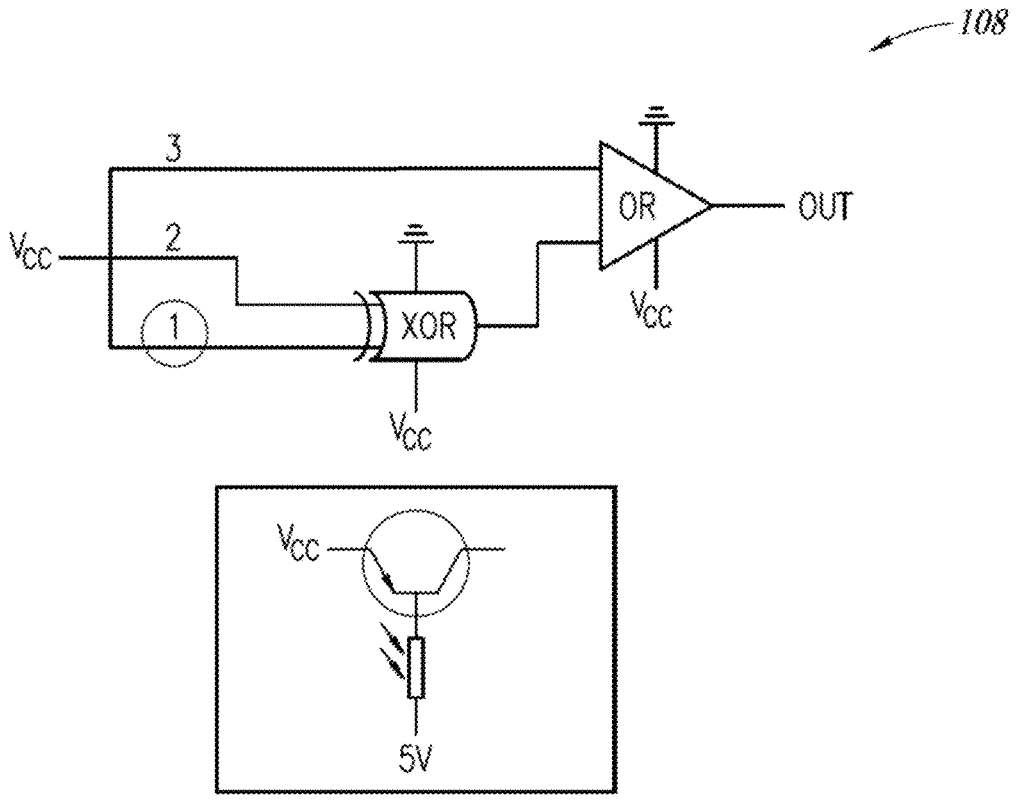
FIG. 10 is a schematic diagram illustrating a small beam detector, which may be included in the photonic logic gates shown in FIG. 6, in accordance with one or more embodiments.

All beams have identical linear polarizations. The detector described below is illustrated in FIG. 10. Finally, the equation used to determine the focusing "power," otherwise known as dioptric power, or "inverse focal length" of the nonlinear material is:

$$f^{-1} = \frac{8n_2 d}{\pi w^4} P,$$

where $n_2$ is the nonlinear refractive index, P is the optical power, w is the beam radius, and d is the nonlinear medium thickness. This shows that the dioptric power of a Kerr lens is related to the intensity of the light passing through it. The unit for inverse focal length is m^-1.

The actual focal length can be found by inverting the formula above, which will result in the equation for focal length, as follows:

$$f = \frac{\pi w^4}{8n_2 P}$$

This equation was used to explore intensities for each optical logic gate configuration. In the tables below, rows A and B refer to the final optical intensity in watts contributed by the beams in each of the arms in the pump beam amplitude adjustment section (e.g., the Mach Zehnder interferometer) after exiting the interferometer. Before the beams exit the Mach Zehnder, the intensity of each arm is actually exactly twice what is written in the tables, because both must pass through a beamsplitter when they are combined. They are then focused to a point specified by the equation above by a convex lens. Their final combined intensity determines the functionality of the gate.

Typically, the Z scan technique requires that the nonlinear material 110 is mechanically moved towards and away from the focal point of intense light. Doing so changes the effective beam size on the surface of the nonlinear material, which changes the extent to which the light is nonlinearly focused or defocused.

Figure 7:
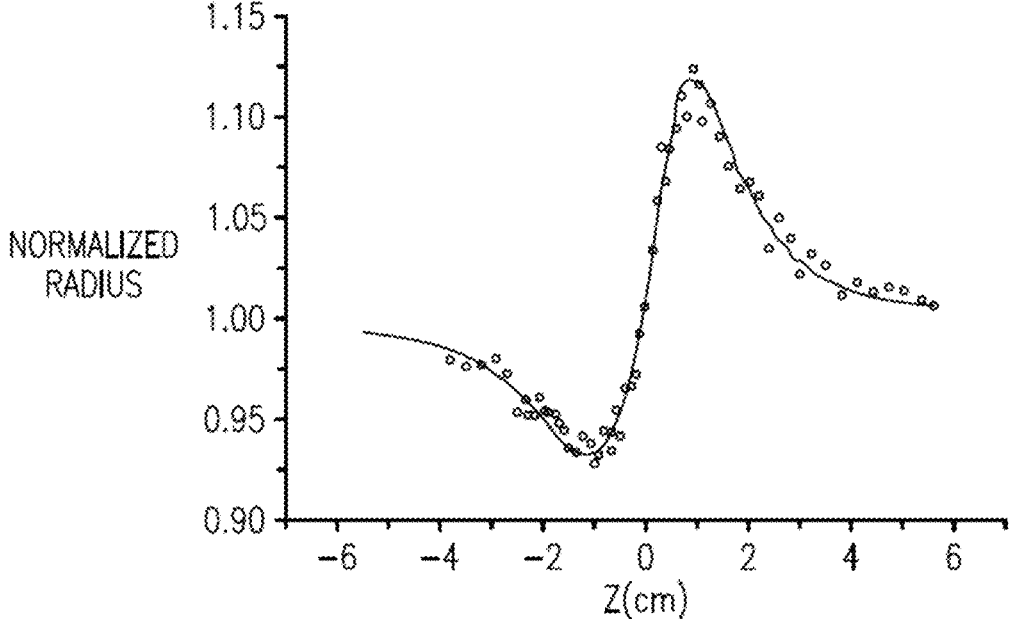
FIG. 7 is a diagram illustrating a relationship between light intensity and nonlinear defocusing.

FIG. 7 shows the relationship between light intensity per unit area and nonlinear defocusing. When the nonlinear material is close to the focal point (but slightly in front of it), the light intensity on the surface of the nonlinear material is at its highest, and therefore gets most defocused in the far field by the light-dependent dioptric strength of the material 110. Then, as the nonlinear material 110 is moved farther away from the focal point, the defocusing effect diminishes to the point of being undetectable.

In one or more embodiments of the present disclosure, instead of physically moving the nonlinear material 110 to enact defocusing, the nonlinear material 110 is mechanically fixed close to the focal point of the light, and the intensity of the light itself is altered to affect changes in the output beam radius on the surface of the detector, and to perform logic operations.

The exact laser wattage for focusing and defocusing change depending on the material 110, but the core concept remains the same. In the logic gates described hereinafter, a brightness of "200" corresponds to a maximally defocused beam, which yields a logical "high" output from the detector. A brightness of "100" refers to half-defocused beam which yields a logical "low." A brightness of "10" refers to the minimum brightness that the detector 108 is capable of detecting, which yields a logical "high." With reference to FIG. 10, brightness values of 10-90 are high, 91-190 are low, 191-200 are high again. More particularly, brightness values of 10-90 activate only Area 1 of the detector 108, which produces a "high" output from the detector 108. Brightness values of 91-190 activate both Area 1 and Area 2, which yields a "low" output from the detector 108. Brightness values of 191-200 activate Area 1, Area 2, and Area 3, which yields a "high" output from the detector 108. The brightness values provided herein are provided examples only, and embodiments of the present disclosure are not limited thereto.

The "starting brightness" refers to the baseline brightness of the light that reaches the detector 108 prior to the activation of the logic gates (e.g., prior to activation of logic gates by light that causes a desired output of the logic gates). The starting brightness value is determined and activated by the computer, which first establishes a voltage potential across the "starting brightness" laser's LC shutter (which may be any of the three lasers 102 as previously described, and which may be referred to as beam C (with beams A and B being input beams from the other two of the three lasers 102)), and then activates the laser itself. After that, any voltage across the LC shutter associated with the subsequent lasers will increase the brightness in addition to the baseline, so that the baseline brightness is added to the total brightness.

Table 1 illustrates operation of the photonic logic gate 610 as a logical AND gate. As shown in Table 1, the presence of both beams (A and B) at the detector 108 is necessary for detection by the detector 108, because the detector 108 has a minimum brightness threshold of 10. Thus, when both beams A and B are present, the combined intensity of beams A and B is 10, and the detector 108 outputs a "1" or logical "high." In contrast, if either or both of beams A and B are not present at the detector 108, the detector 108 outputs a "0" or logical "low."

TABLE 1

| AND | | |
|---|---|---|
| INPUT | | |
| A | B | OUTPUT |
| 0 | 0 | 0 |
| 5 | 0 | 0 |
| 0 | 5 | 0 |
| 5 | 5 | 1 |

Table 2 illustrates operation of the photonic logic gate 610 as a logical OR gate. As shown in Table 2, the presence of either beams (A and B) at the detector 108 is sufficient for detection by the detector 108, because the detector 108 has a minimum brightness threshold of 10 and each of beams A and B are output with an intensity of 10. Thus, when either of beams A or B are present, the detector 108 outputs a "1" or logical "high." In contrast, if both beams A and B are not present at the detector 108, the detector 108 outputs a "0" or logical "low."

TABLE 2

| OR | | |
|---|---|---|
| INPUT | | |
| A | B | OUTPUT |
| 0 | 0 | 0 |
| 10 | 0 | 1 |
| 0 | 10 | 1 |
| 10 | 10 | 1 |

Table 3 illustrates operation of the photonic logic gate 610 as a logical NAND gate. In the NAND gate, the starting brightness (e.g., as provided by beam C) may be at 10. As shown in Table 3, the two inputs (i.e., both beams A and B at brightness of 45) are necessary to defocus the final beam and activate Area 2 on the detector (D), thus yielding a "1" or logical "high" in every case except when both beams are running at full brightness (e.g., brightness of 45).

TABLE 3

| NAND | | |
|---|---|---|
| INPUT | | |
| A | B | OUTPUT |
| 0 | 0 | 1 |
| 45 | 0 | 1 |
| 0 | 45 | 1 |
| 45 | 45 | 0 |
| Starting brightness: 10 | | |

Table 4 illustrates operation of the photonic logic gate 610 as a logical NOR gate. In the NOR gate, the starting brightness (e.g., as provided by beam C) may be at 90. As shown in Table 4, either or both of beams A and B (e.g., at brightness of 10) is bright enough to activate Area 2 on the detector 108, thus yielding a "0" or logical "low." Beams A and B are of low enough brightness that if they are both present at the same time, they do not activate Area 3, and thus the detector 108 will output a "0" or logical "low" in this scenario as well. The maximum brightness of this gate is 120 in this example, which is low.

TABLE 4

| NOR | | |
|---|---|---|
| INPUT | | |
| A | B | OUTPUT |
| 0 | 0 | 1 |
| 10 | 0 | 0 |
| 0 | 10 | 0 |
| 10 | 10 | 0 |
| Starting brightness: 90 | | |

Table 5 illustrates operation of the photonic logic gate 610 as a logical XOR gate. As shown in Table 5, both of beams A and B (e.g., at brightness of 50) are bright enough to unilaterally be detected by the detector 108 (e.g., to output a "1" or logical "high"), but when both beams A and B are present at the same time, the final output is focused enough to yield a "0" or logical "low" as output from the detector 108.

TABLE 5

| XOR | | |
|---|---|---|
| INPUT | | |
| A | B | OUTPUT |
| 0 | 0 | 0 |
| 50 | 0 | 1 |
| 0 | 50 | 1 |
| 50 | 50 | 0 |

Table 6 illustrates operation of the photonic logic gate 610 as a logical XNOR gate. In the XNOR gate, the starting brightness (e.g., as provided by beam C) may be at 10. As shown in Table 6, either of beams A and B (e.g., at brightness of 95) is bright enough to defocus the light and activate Area 2 on the detector 108, thus yielding a "0" or logical "low." However, when both beams A and B are present at the same time, they have a combined intensity of 200 (including the intensity of the starting brightness), which activates area 3 and causes the detector 108 to output a "1" or logical "high."

TABLE 6

| XNOR | | |
|---|---|---|
| INPUT | | |
| A | B | OUTPUT |
| 0 | 0 | 1 |
| 95 | 0 | 0 |
| 0 | 95 | 0 |
| 95 | 95 | 1 |
| Starting brightness: 10 | | |

Figure 8:
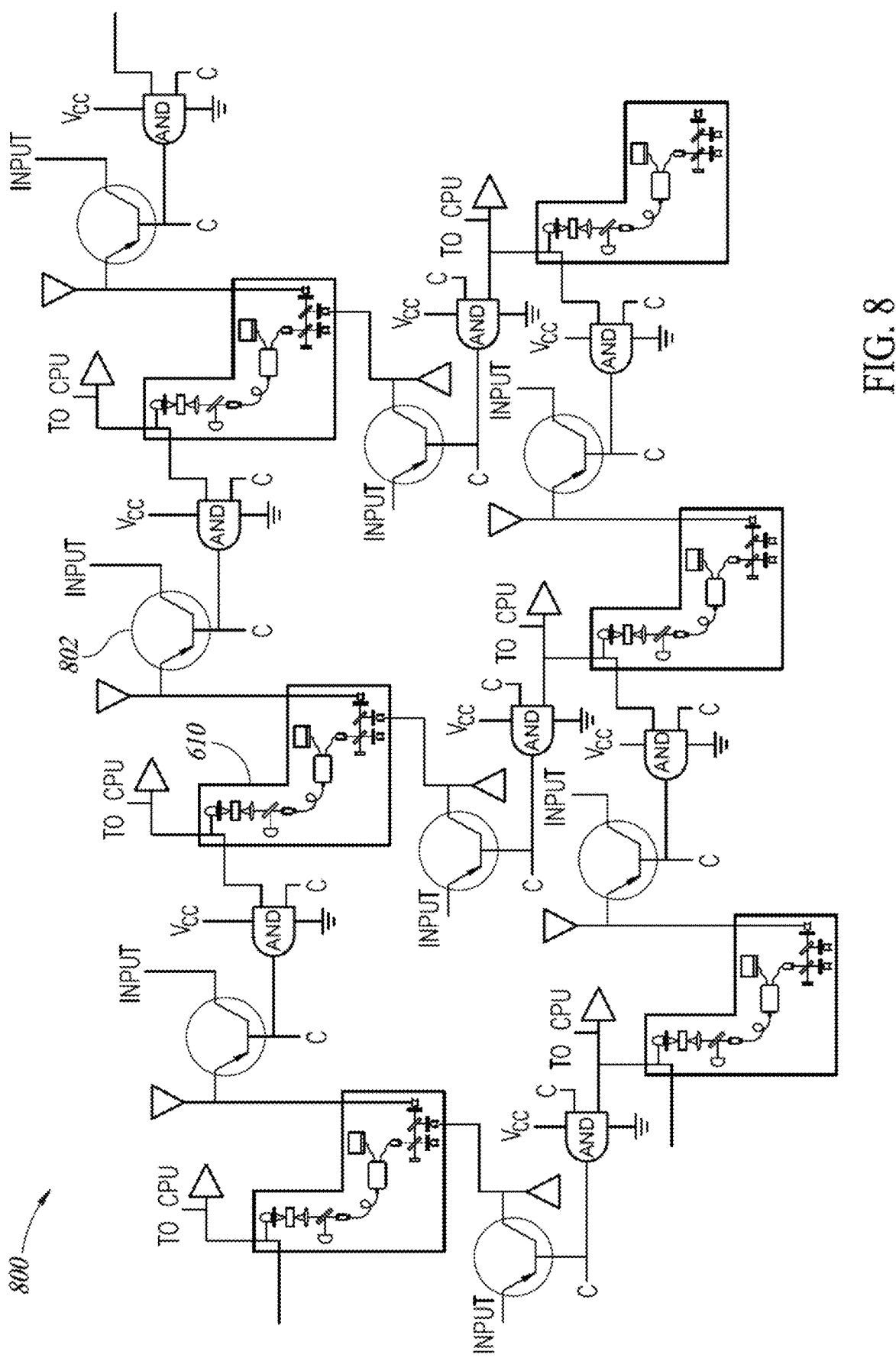
FIG. 8 is a schematic diagram illustrating an array of photonic logic gates which may be coupled to one another, in accordance with one or more embodiments.

FIG. 8 illustrates a plurality of photonic logic gates 610 arranged in an array 800 and daisy-chained or otherwise coupled to one another. Each of the photonic logic gates 610 may interact with one another in a variety of configurations in order to implement various different logical functions. The array 800 may represent some of the photonic logic gates 610 which may be included in photonic layer 2. While not shown in FIG. 8, it will be readily appreciated that each of the photonic logic gates 610 may include a microprocessor or microcontroller 506, for example, as shown in FIG. 5.

The individual high power photonic logic gates 610 are modules that may be linked in series just like the low power gates 10 in the low power photonic layer 1. In the high power photonic layer 2, the photonic logic gates 610 are linked together electronically through a combination of an AND gate and a transistor, with the detector 108 being the activating mechanism between other cells on photonic layer 2. The photocoupling layer connects the logic gates 10 in photonic layer 1 with subsequent lasers on photonic layer 2. Similarly, the detectors 108 in photonic layer 2 may activate the lasers in photonic layer 1 through the photocoupling layer. This will be described in further detail later herein. The point at which photonic layer 2 connects with the photocoupling layer is shown here as an arrow near any transistor. Throughout this document, the arrows represent connections to the photocoupling layer, with arrows pointing toward a wire indicating that information flows from the photocoupling layer, and arrows pointing away from the wire indicating that information flows to the photocoupling layer (e.g., via the photocoupling layer pins 502). Each detector 108 is connected to the computer (e.g., to any computer or processing circuitry, such as may be included in the chips or electronic layer shown in FIG. 5) through a connector labeled "to CPU" in each diagram.

The computer (i.e., the electronics layer) will provide one input (e.g., input "C") for each AND gate to link gates that are meant to interact sequentially when one of them has a high digital output. The computer will also provide variable voltage from the transistors 802 via the connector labeled "input" if the AND gate is on in order to drive the subsequent laser. For example, the computer may provide an input signal ("input") that is provided at a conduction terminal of the transistor 802. When the output of the AND gate is active or high, the transistor 802 operates in a conductive state which causes the input signal (provided from the computer) to pass to an input (e.g., to a laser input) of a subsequent laser of logic gate. The signal "C" at a control terminal of the transistor 802 is a computer signal that is distinct from signal "C" that is provided at the input of the AND gate. The signal "C" at the transistor 802 control terminal allows the computer to individually control activation of any photonic gate without relying on processing from one or more prior gates.

In the example of FIG. 8, all of the logic inputs labeled "C" are digital inputs provided by the computer from the electronics layer. Note that the computer can trigger any subsequent laser manually, but can also conditionally trigger any subsequent laser through its AND gate, so that whether or not it is on depends on whether or not there is a digital signal from another source (another cell from any layer) powering the second input of the AND gate. When cells are connected, the computer must power one half of the AND gate in order to "confirm" the connection. When cells are not connected, the computer must power the subsequent lasers manually.

A high digital output from the detector 108 is output to the computer (i.e., the electronics layer) through an output connection labeled "to CPU" in these diagrams. The high digital output also provides the second high input to an adjacent AND gate to allow the computer to activate one subsequent laser in the cells above the detector and to its left. In doing so the detector 108 either triggers the necessary laser wattage for one "high" input in a subsequent logic gate, or leaves that input completely off. When necessary or otherwise desired, the computer may activate both lasers in one cell. This provides two mechanisms for activating the subsequent laser in the photonic circuit, as follows:

1) By satisfying a digital ON condition in a detector in a nearby cell regardless of which layer that cell is on, and 2) By having the computer trigger the gate manually.

Figure 9:
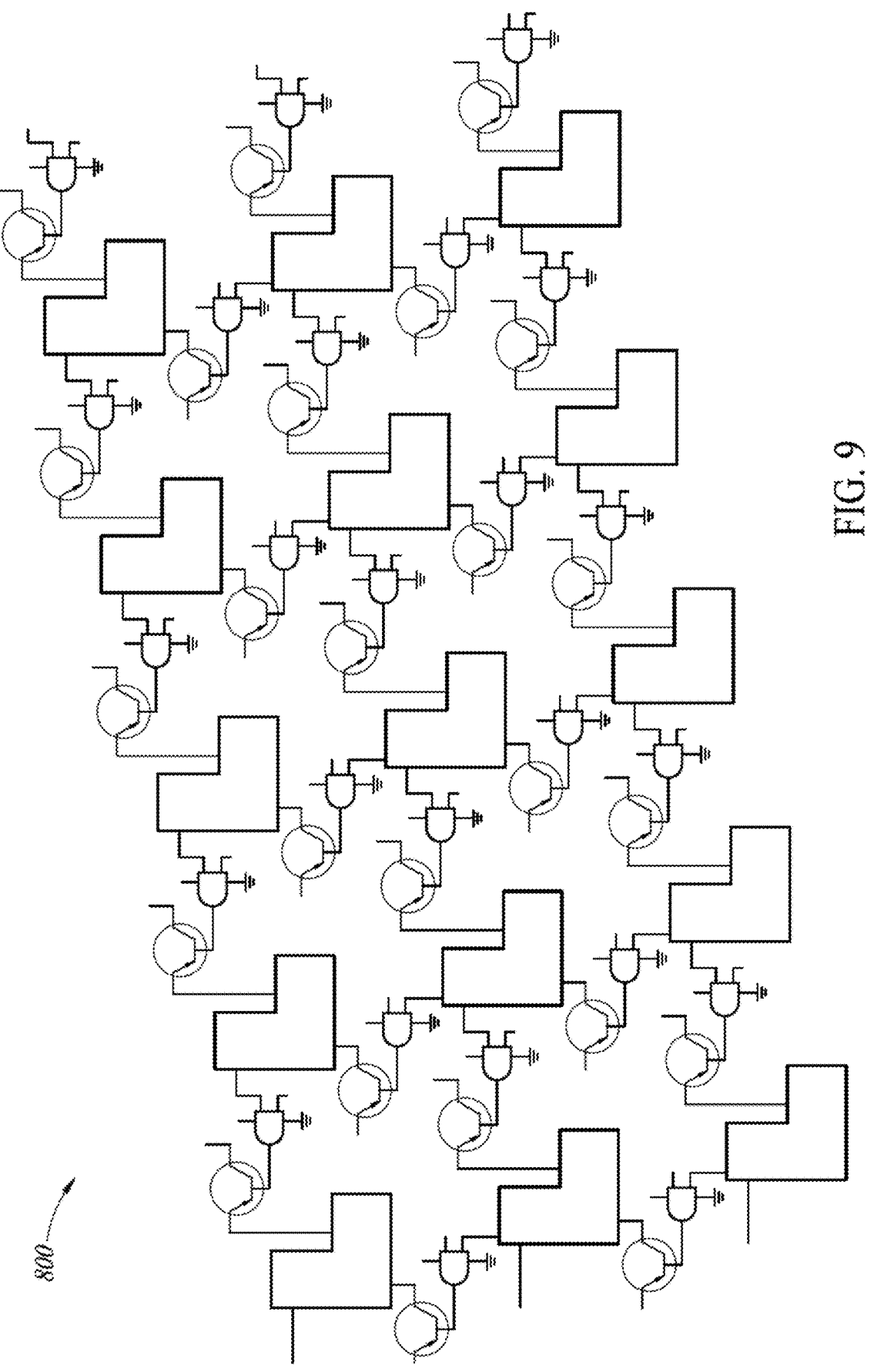
FIG. 9 is a schematic diagram illustrating further details of the array of photonic logic gates shown in FIG. 9, in accordance with one or more embodiments.

The computation within a cell on photonic layer 2 happens at the speed of light, and the information flow between gates runs as fast as the switching speed of the transistors in the logic gates—on the order of microseconds. For reference, FIG. 9 illustrates a zoomed out abstraction of a large group of sequentially linked all-optical photonic gates 610 in the array 800 to give an idea of how the architecture behaves on a large scale.

FIG. 10 illustrates a small beam detector, which may be the detector 108 included in each of the photonic logic gates 610. A key purpose of the small beam detector 108 is to connect cells that are adjacent, or connect cells between layers, or to output a result to a processor on the electronic layer. The small beam detector 108 has three active areas, as previously discussed, each of which includes a photoresistor at the base of a transistor. Area 1 is placed at the center of the beam, and triggers its transistor when the incident light is bright enough, producing a high logic output. When the beam expands, it can trigger area 2.

Area 2 is activated when the beam defocuses sufficiently. It produces a logic output of one as well, and when it combines with the high logic output from area 1, it causes the detector to have a total output of zero, due to the XOR gate to which both 1 and 2 are connected. When the beam expands, it can trigger Area 3.

Area 3 is at the outside edge of the maximum beam defocusing radius. When the beam is maximally defocused (or is close to it) it activates, and provides a high logic output that allows the detector to have a high output despite A and B both being activated as well. This is necessary for the XNOR gate.

As previously mentioned, the detector 108 may be calibrated such that it only registers light of a specific intensity. This can be done in at least three ways in various embodiments, as follows:

1) Through the electronic circuit, by putting resistors between the photoresistor and the base of the transistor.

2) Optically, by installing neutral density filters (or absorptive linear polarizers at an angle nearly orthogonal to the polarization plane of the input light) in front of the detector. Importantly, the filter itself would be susceptible to optical damage depending on its material.

3) Materially, by making the sensitivity of the photodetector a property of the photoresistor itself.

Setting a minimum threshold may be necessary for the functioning of an AND gate on photonic layer 2.

In the photonic layer 2 circuitry (e.g., in the photonic logic gates 610), the detector 108 may trigger logic gates and connect individual all-optical photonic logic gate cells together using its digital outputs.

Figure 11:
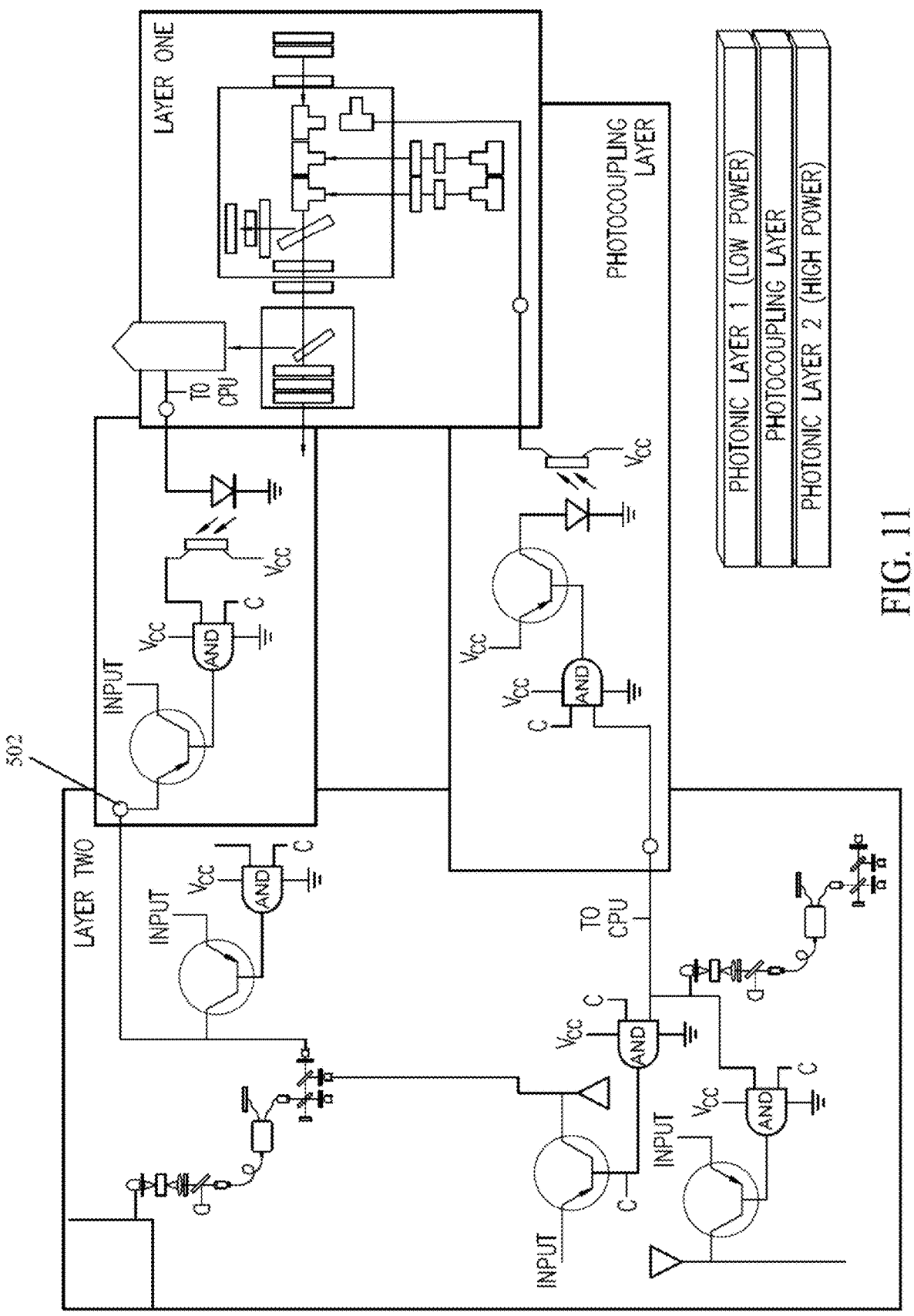
FIG. 11 is a schematic diagram illustrating a photocoupling layer which may be included in the optical computing system of FIG. 5, in accordance with one or more embodiments.

FIG. 11 schematically illustrates the photocoupling layer, as well as the coupling of the photonic layers 1 and 2 via the photocoupling layer.

As shown, the photocoupling layer may be disposed between photonic layers 1 and 2 and may connect the logic gates between the two photonic layers sequentially and allows them to interface via a photocoupler rather than having to go through the electronic layer. This takes a significant load off of the electronics layer during computations. Again, in this diagram, each "input" label refers to a variable voltage input from the electronics layer.

More specifically, the photocoupling layer allows the detectors 108 of one photonic layer to trigger or disable specific systems (e.g., low-power lasers in layer one, or subsequent lasers in layer two) of the other layer. In some embodiments, the detector 108 previously discussed herein may be implemented on every layer. This photocoupling layer is connected to the electronics layer as well so that the computer may provide the other half of the inputs for some of the AND gates, as specified by the user, as well as supply power for their logic outputs through transistors. In this diagram, all of the logic inputs labeled "C" are provided by the computer from the electronics layer. The connections to the photocoupling layer may be shown as a circle here, and all illustrations in this document. For example, each of the circles showing the connections between the photonic layers 1 and 2 and the photocoupling layer may represent a photocoupling pin 502.

The inclusion of the photocoupling layer may require some subtle changes to photonic layers 1 and 2, and may require the inclusion of a few extra circuitry components as will be described herein.

Figure 12:
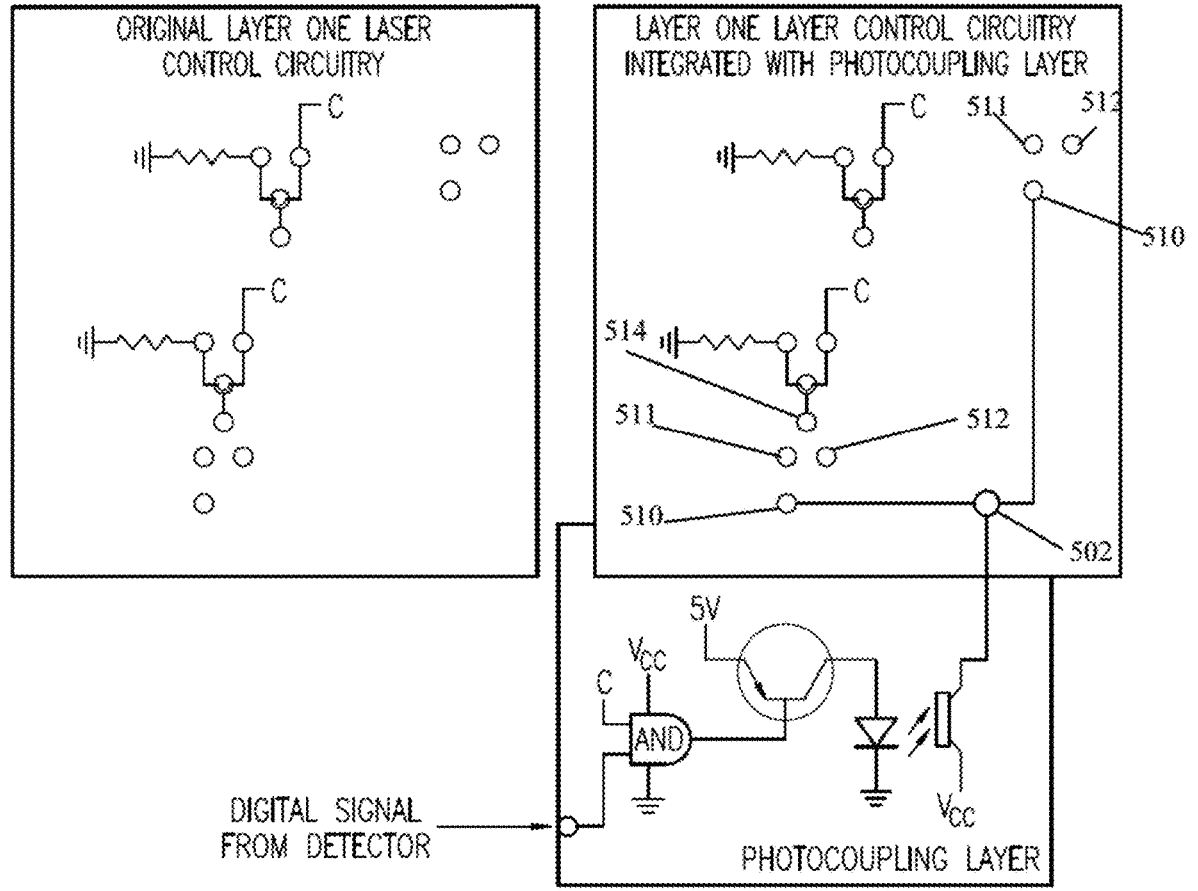
FIG. 12 is a schematic diagram illustrating coupling between the photocoupling layer and a first photonic layer, in accordance with one or more embodiments.

As shown in FIG. 12, for photonic layer 1, the photocoupling layer connects through the board of the laser control circuitry in a typical layer one cell (e.g., a photonic logic gate of the photonic layer 1), and acts as a triggering mechanism for both lasers in its cell. The circuits illustrated in FIG. 12 may be implemented in embodiments in which the laser is a TTL laser; however, embodiments provided herein are not limited thereto, and in various embodiments, any suitable laser (e.g., VCSEL) may be utilized. The intensity with which the lasers actually propagate through the circuit (and which lasers propagate at all) is determined by the voltage across the rotators in that cell, and that preference can be set manually by the user in layer one's cell's program. In the diagram of FIG. 12, all of the logic inputs labeled "C" are provided by the computer from the electronics layer. This is an advantageous design because it means that no matter what the gate setting is in a given cell, a high digital input from an adjacent cell will always trigger an input relevant to the functioning of that specific logic gate, as determined by the intensity of the beam.

In embodiments in which the laser is a TTL laser, each of the laser control circuits may include a first node 510, a second node 511, and a third node 512. The first node 510 may be utilized to provide a trigger signal (e.g., from the electronics layer) for triggering the laser or otherwise initiating a laser emission. The second node 511 may be connected to a reference voltage, e.g., an electrical ground voltage which may provide a ground reference for the laser. The third node 512 may be utilized to provide a power signal (e.g., from the electronics layer) to the laser.

In some embodiments, a fourth node 514 may be coupled to a control terminal of the transistors, which may be, for example, a base terminal of a bipolar junction transistor in some embodiments. In some embodiments, each of the optical shutters 26 of the photonic logic gates 10 may be electrically coupled or connected between two of the fourth nodes 514 of a respective laser control circuit. The fourth node 514, in some embodiments, may be utilized to supply a control signal which controls the turning ON or OFF of the transistors in each of the laser control circuits. When the transistors are turned ON, electrical charges which may be stored by the optical shutter 26 may be discharged, e.g., to ground through a resistor. When the transistors are turned OFF, one or more optical properties of the optical shutters 26 (e.g., transmissivity, opacity, or the like) may be controlled or otherwise adjusted based on the logical input signal "C" provided from the electronics layer. For example, the logical input signal "C" may be utilized to charge the optical shutters 26, which may act as capacitors to store electrical charge. The charging of the optical shutters 26 may cause a change or adjustment in the optical properties (e.g., transmissivity, opacity, or the like) of the optical shutters 26. Accordingly, by controlling a state of charge of the optical shutters 26 a desired amount of light may be blocked or transmitted through the optical shutters 26.

Importantly, the location of the photocoupling layer's circuitry is shown here for conceptual purposes, and its exact layout depends on the layouts of the other two layers (e.g., of photonic layers 1 and 2).

Figure 13:
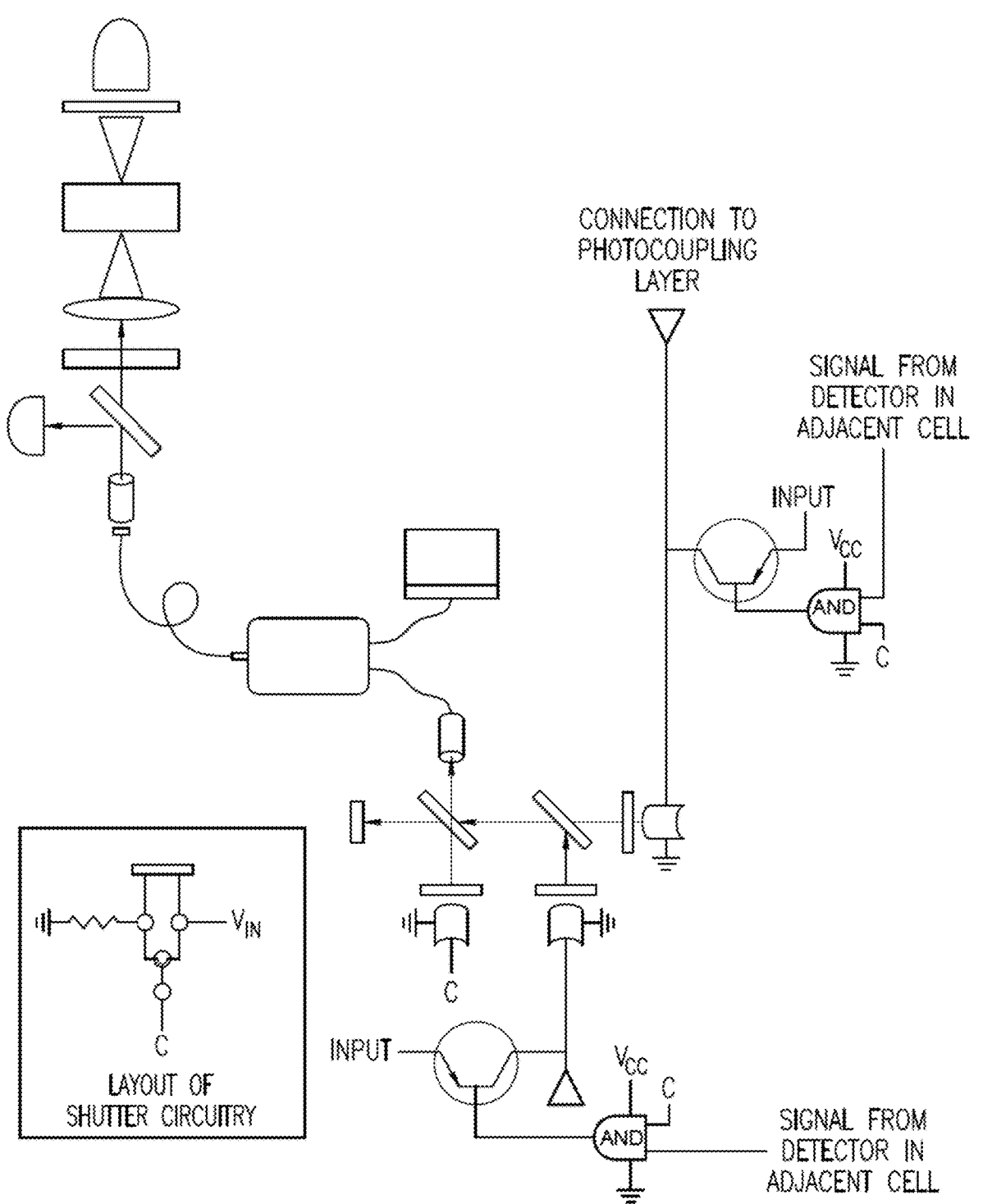
FIG. 13 is a schematic diagram illustrating coupling between the photocoupling layer and a second photonic layer, in accordance with one or more embodiments.

As shown in FIG. 13, for photonic layer 2, the circuitry components are shown connected to each subsequent laser, including those which connect to cells in photonic layer 1 via the photocoupling layer. In this diagram, all of the logic inputs labeled "C" are provided by the computer from the electronics layer.

Figure 14:
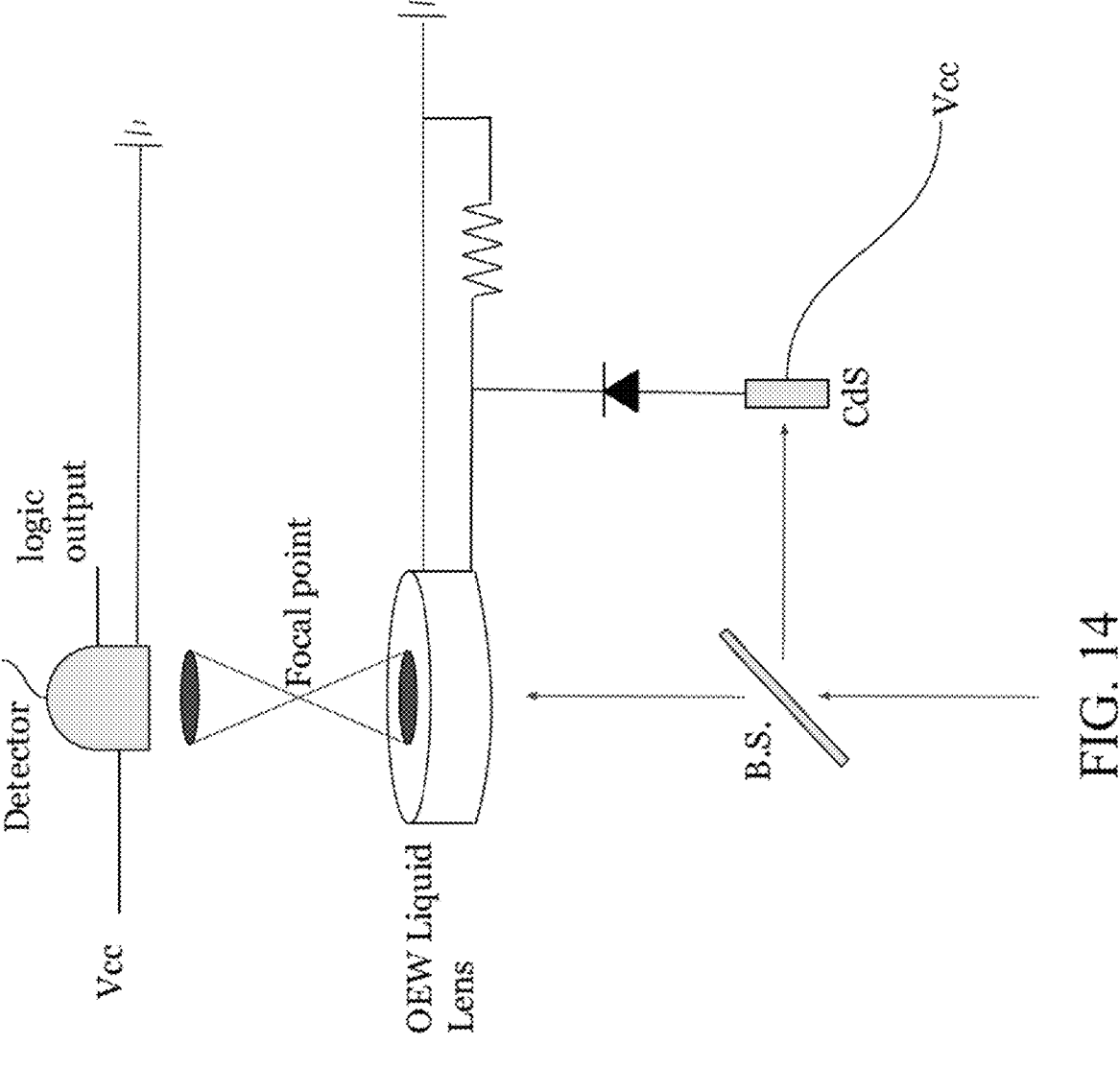
FIG. 14 is a schematic diagram illustrating an optically configurable lensing module, in accordance with some embodiments.

FIG. 14 is a schematic diagram illustrating an optically configurable lensing module 710 that acts similarly to the nonlinear material 110 in photonic layer 2, in accordance with some embodiments. The lensing module 710 includes an optical electrowetting (OEW) liquid lens. In some embodiments, the voltage across the liquid of the liquid lens causes the liquid to deform, and by doing so, adjusts the focal point of the transitive light.

As shown, laser light is directed into a beamsplitter (which may be the same or substantially the same as the beamsplitter 118 previously described herein) for a finite amount of time. Half of the laser light is reflected into a photoresistor (which may be, for example, a CdS photoresistor), which releases current into the OEW liquid lens, of an amount proportional to the intensity of the light. The rest of the light passes through the liquid lens, and is focused at a point in front of the lens. Since the current to the OEW liquid lens depends on the intensity of the beam, the exact focal distance of the portion of the beam that passes through the OEW liquid lens also depends on the brightness of the input beam. The OEW liquid lens module acts as a natural capacitor, and so a resistor may be placed between its leads to pull it to ground, and reset the curvature of the OEW liquid lens.

After being focused at a variable distance by the liquid lens, the light is projected onto the surface of the detector (which, in some embodiments, may be the same as the logic detector 108 previously described herein). As previously noted, the amount of the surface of the detector that is illuminated determines the circuit's logic output. Changing the focal point of the transitive beam by changing the laser's input brightness affects how much of the total surface of the detector is illuminated, and so ultimately determines the logic output of the circuit.

Any means of modulating the brightness of the laser may precede the microfluidic module 710 in a circuit. Furthermore, the polarization of the transient light does not matter in this circuit. For this reason, and also due to the similarity of the microfluidic module 710 to the nonlinear material 110, gates in the microfluidic module 710 may be made in the same or substantially the same way that the high-power gates are, but operates at only a few volts with laser intensities in the milliwatts. It is also easier to miniaturize, with the size of the liquid lens being the only limiting factor. However, the microfluidic module 710 may operate slower than photonic layers 1 or 2, due to the millisecond-degree sluggishness of the liquid within the OEW liquid lens.

In some embodiments, the microfluidic module 710 may replace the nonlinear material 110 in the high-power photonic logic gates 610, for example, if the mode locking is disabled, and the lasers in the photonic logic gates 610 were on for entire microseconds.

Figure 15:
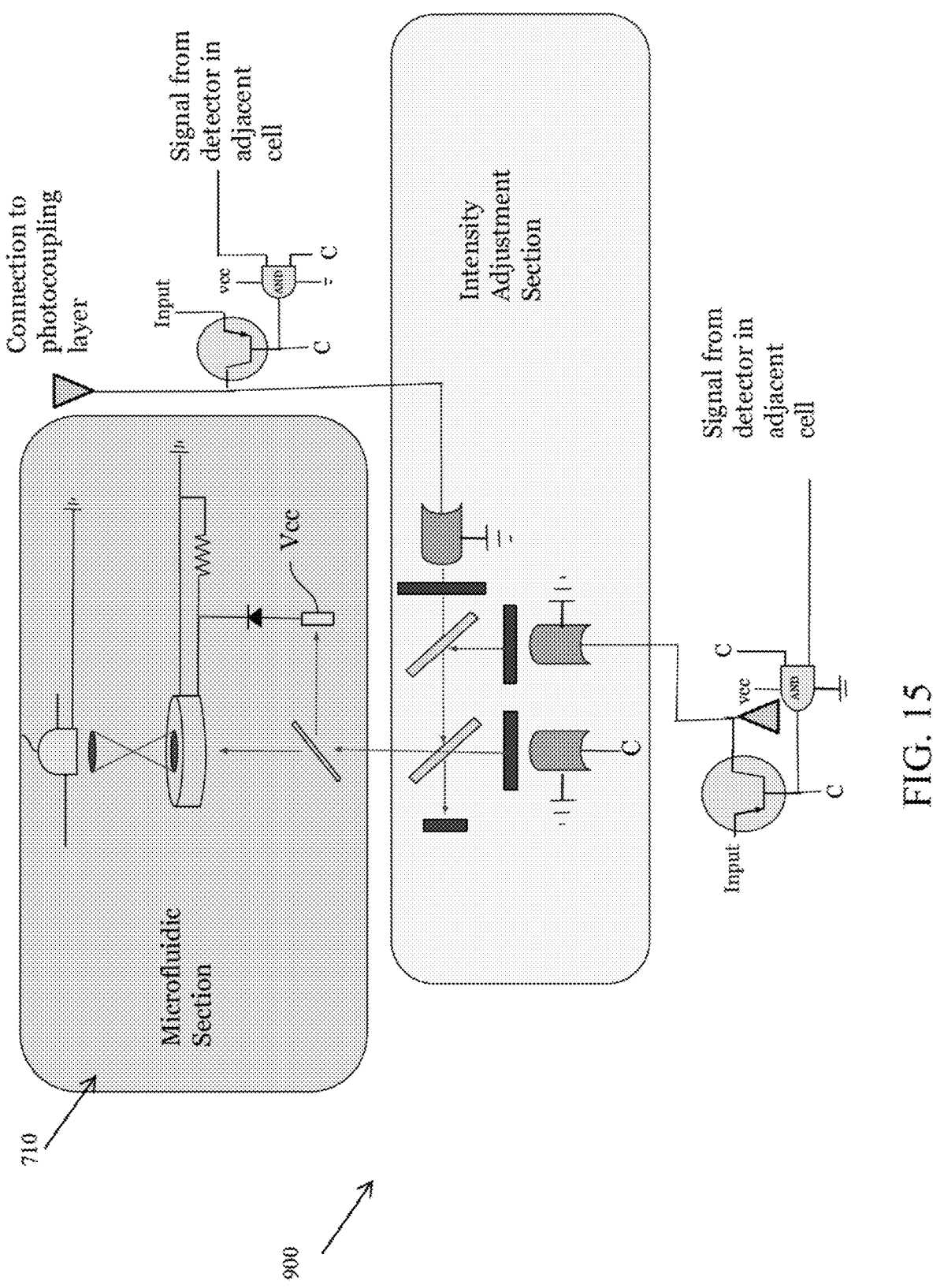
FIG. 15 is a schematic diagram illustrating a microfluidic circuit, in accordance with some embodiments.

FIG. 15 is a schematic diagram illustrating a microfluidic circuit 900, in accordance with some embodiments. The microfluidic circuit 900 includes the microfluidic module 710, which may be attached directly to intensity adjustment circuitry (or "intensity adjustment section" as shown in FIG. 15), which in some embodiments may be the same or substantially the same as the circuitry from the gain-compression section or "pump beam amplitude adjustment section" in the high-power logic gate diagrams (see, e.g., FIG. 6). However, the lasers utilized in the microfluidic circuit 900 need not be at any particular wavelength, and may instead be selected based on the absorption spectra of the photoresistive material used in the microfluidic section (for example, in the case of CdS, the ideal wavelength is around 500 nm). Their role is to simply sum together at the surface of the photoresistive material and determine the total brightness present in the microfluidic section. That is to say that this section determines the focal distance of the liquid lens.

Figure 16:
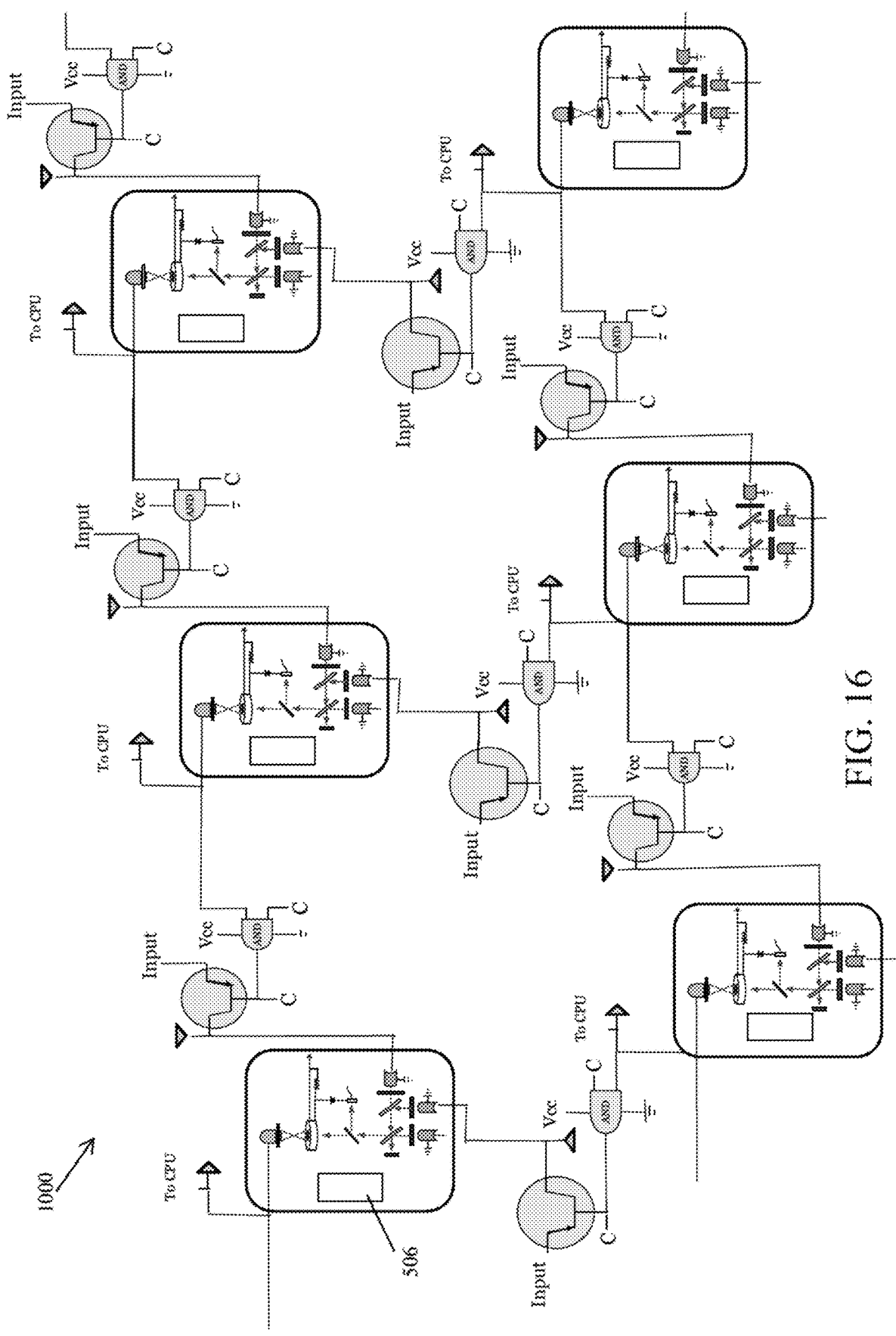
FIG. 16 is a schematic diagram illustrating an array of microfluidic circuits which may be coupled to one another, in accordance with one or more embodiments.

FIG. 16 is a schematic diagram illustrating an array 1000 of microfluidic circuits 900 which may be coupled to one another, in accordance with one or more embodiments. Each of the microfluidic circuits 900 (which, as described herein, may include one or more features of the photonic logic gates 610) may interact with one another in a variety of configurations in order to implement various different logical functions.

As shown in FIG. 16, the array 1000 may include various connectors for integration into the photocoupling layer, in the same or similar manner as previously described herein, for example, with respect to the array 800 shown in FIG. 8.

The use of the microfluidic modules (e.g., and the array 1000) represents an option, in accordance with some embodiments, that may be attached modularly to the electronics layer, and may be interfaced with one or both of the photonic layers 1 and 2 using the same repeating architecture as the high-power layer (e.g., the photonic layer 2). As shown in FIG. 16, each of the microfluidic circuits 900 may include a microprocessor or microcontroller 506, for example, as previously described herein with respect to FIG. 5.

In view of the various embodiments described herein, the present application facilitates selection of several different kinds of circuits (e.g., different types of photonic logic gates or microfluidic circuits) which may be implemented, for example, when designing a computer, such as the system 500. Based on design considerations, in some embodiments, all of the layers described herein (e.g., the photonic layers 1 and 2, and the array 1000 of microfluidic circuits 900) may be selected for inclusion in a computer (e.g., in the system 500) and the layers may be connected and communicatively coupled with one another with one or more photocoupling layers.

It is noted that a photocoupling layer, in some embodiments, may only allow adjacent layers to communicate directly with one another. If information is desired to travel between gates that are not directly adjacent (from a layer 3 to a layer 6 for example) it may not be able to connect directly to its destination and instead may need to pass through multiple layers to get to the desired destination.

In some embodiments, pinouts may be provided or included which connect boards to other boards (e.g., one or more of the layers described herein) and photocoupling layers may be provided between each such board. In some embodiments some or all of the layers may be provided as physical cartridges that plug neatly into slots accessible by the electronics layer. The cartridge design facilitates establishing an electronic connection that can let the computer (i.e., the electronics layer) manage all of the "C" connections neatly.

This includes the connections that give instructions to the monolithic microcontroller modules that manage the pins that make individual logic gates. Each individual logic gate has one microcontroller (e.g., microcontroller 506) which may have wiring to the electronics layer located, for example, at the bottom of the chip or layer in which the logic gate is included. All of the other wiring pertinent to processing may be included, for example, at the top of the chip. Pins to other gates may be located at the top and bottom of the chip as may be desired, but they do not get in the way of the microcontrollers due to their physical locations.

The various embodiments described above can be combined to provide further embodiments. To the extent that they are not inconsistent with the specific teachings and definitions herein, all of the U.S. patent applications which are owned by the present Applicant: U.S. Non-Provisional patent application Ser. No. 16/177,816, U.S. Provisional Patent Application Ser. No. 62/647,394, U.S. Provisional Patent Application Ser. No. 62/584,805, U.S. Provisional Patent Application Ser. No. 62/584,806, and U.S. Provisional Patent Application Ser. No. 62/612,405 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A photonic logic gate selectively configurable to generate a logical output based on an intensity and a polarization of at least a first input light and a second input light, the photonic logic gate comprising:

a managed input configured to receive at least a third input and a fourth input emitted from respective embedded lasers, the managed input further configured to output at least one of an A-polarized beam and a B-polarized beam based on a user-set intensity;

said managed input including: a first filter assembly corresponding to polarization state 'A', communicatively coupled to the third input, the first filter assembly comprising a blocking polarizer, a rotator, and a passing polarizer arranged in succession; and a second filter assembly corresponding to polarization state 'B', communicatively coupled to the fourth input, the second filter assembly comprising a passing polarizer, a rotator, and a blocking polarizer arranged in succession;

a first input path configured to selectively receive the first input light;

a second input path configured to selectively receive the second input light, the second input path including an optoelectronic assembly comprising a first rotator, an absorptive linear polarizer, and a second rotator in series, the optoelectronic assembly configured to selectively control an intensity and a polarization of the second input light;

a plurality of optical shutters configured to control passage of light;

a plurality of absorptive linear polarizers;

a plurality of liquid crystal rotators;

a beamsplitter;

a polarized beam splitter configured to separate input polarizations into a first separate path and a second separate path;

a photosensitive circuit path, corresponding to the said first separate path and configured to receive a canceling polarization (B'), the photosensitive circuit path comprising: a photoresistor selectively configured to detect a target light intensity; and a rotator and an absorptive linear polarizer in series, positioned between the polarized beam splitter and the photoresistor;

wherein the photoresistor is configured to, responsive to detecting the 'B'-state polarization light intensity, trigger at least one of the plurality of optical shutters to selectively block or pass a beam in the said second separate path;

a plurality of optical networking devices, positioned to overlap beams regardless of polarization;

and an output system comprising a photodetector configured to receive beam 'A', wherein a logical output is generated based on an intensity of the received processed light meeting or not meeting a minimum brightness threshold at the photodetector.

2. An optical computing system, comprising: a first photonic layer comprising a plurality of first photonic logic gates, wherein at least one of said plurality of first photonic logic gates is a photonic logic gate as recited in claim 1;

a second photonic layer comprising a plurality of second photonic logic gates;

an electronic layer; and a photocoupling layer, physically disposed between said first photonic layer and second photonic layer, the photocoupling layer comprising: a plurality of photocoupling layer pins configured to communicatively couple said photocoupling layer to said first photonic layer and to second photonic layer;

wherein the photocoupling layer is configured to directly communicate signals between logic gates of the first photonic layer and logic gates of the second photonic layer via photocoupling;

wherein the photocoupling layer is configured to allow detectors of one of said first or second photonic layers to trigger or disable specific systems of the other of said first or second photonic layers; and wherein the photocoupling layer is communicatively coupled to the electronic layer;

wherein the electronic layer is configured to manage operation of components within at least one of the first photonic layer and the second photonic layer, and to selectively assign processing operations between the first photonic layer and the second photonic layer.

*  *  *  *  *